US012676192B2

(12) United States Patent
Chai et al.

(10) Patent No.: US 12,676,192 B2
(45) Date of Patent: Jul. 7, 2026

(54) MEMORY DEVICE FOR SUPPORTING EFFICIENT ERASE OPERATION AND OPERATING METHOD OF MEMORY DEVICE

(71) Applicant: SK hynix Inc., Gyeonggi-do (KR)

(72) Inventors: Soo Yeol Chai, Gyeonggi-do (KR); Cheol Joong Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 204 days.

(21) Appl. No.: 18/585,052

(22) Filed: Feb. 23, 2024

(65) Prior Publication Data

US 2025/0131962 A1 Apr. 24, 2025

(30) Foreign Application Priority Data

Oct. 20, 2023 (KR) ........................ 10-2023-0141503

(51) Int. Cl.
G11C 16/16 (2006.01)
G11C 16/04 (2006.01)
G11C 16/34 (2006.01)

(52) U.S. Cl.
CPC .......... G11C 16/16 (2013.01); G11C 16/0483 (2013.01); G11C 16/3445 (2013.01)

(58) Field of Classification Search
CPC . G11C 16/16; G11C 16/0483; G11C 16/3445; G11C 16/3477; G11C 16/14; G11C 16/32
See application file for complete search history.

(56) References Cited

U.S. PATENT DOCUMENTS

| | | | | |
|---|---|---|---|---|
| 10,699,789 B2 | 6/2020 | Lee et al. | | |
| 10,825,530 B2 * | 11/2020 | Song | ...................... | G11C 16/16 |
| 2018/0188958 A1 * | 7/2018 | Kim | ...................... | G06F 3/0655 |
| 2019/0279720 A1 * | 9/2019 | Nam | ...................... | H10B 43/40 |
| 2020/0143893 A1 * | 5/2020 | Rabkin | .............. | G11C 16/3445 |
| 2020/0411105 A1 * | 12/2020 | Lee | .......... | G11C 16/14 |
| 2022/0301643 A1 * | 9/2022 | Funatsuki | .......... | G11C 11/2273 |
| 2024/0105271 A1 * | 3/2024 | Zhang | ................... | G11C 16/16 |
| 2024/0194269 A1 * | 6/2024 | Kim | ...................... | G11C 16/16 |
| 2024/0312539 A1 * | 9/2024 | Kweon | .............. | G11C 16/0483 |
| 2024/0379168 A1 * | 11/2024 | Choi | ................. | G11C 16/3445 |
| 2025/0006274 A1 * | 1/2025 | Jiang | ...................... | H10B 41/44 |

FOREIGN PATENT DOCUMENTS

KR 10-2021-0147365 A 12/2021

* cited by examiner

*Primary Examiner* — Amir Zarabian
*Assistant Examiner* — Justin Bryce Heisterkamp
(74) *Attorney, Agent, or Firm* — IP & T GROUP LLP

(57) ABSTRACT

A memory device includes a memory block having multiple string groups, and a controller configured to repeat one or more erase loops, each erase loop including a pulse application interval and a verification interval, configured to determine the multiple string groups as one of pass and fail string groups in a verification interval of a previous erase loop, and configured to apply a first voltage to a drain selection line corresponding to the fail string group from start timing to first timing, apply the first voltage to a drain selection line corresponding to the pass string group from the start timing to second timing earlier than the first timing, and apply a second voltage to the drain selection line from the second timing to the first timing in a pulse application interval of a subsequent erase loop subsequent to the previous erase loop.

20 Claims, 8 Drawing Sheets

FIG. 1A

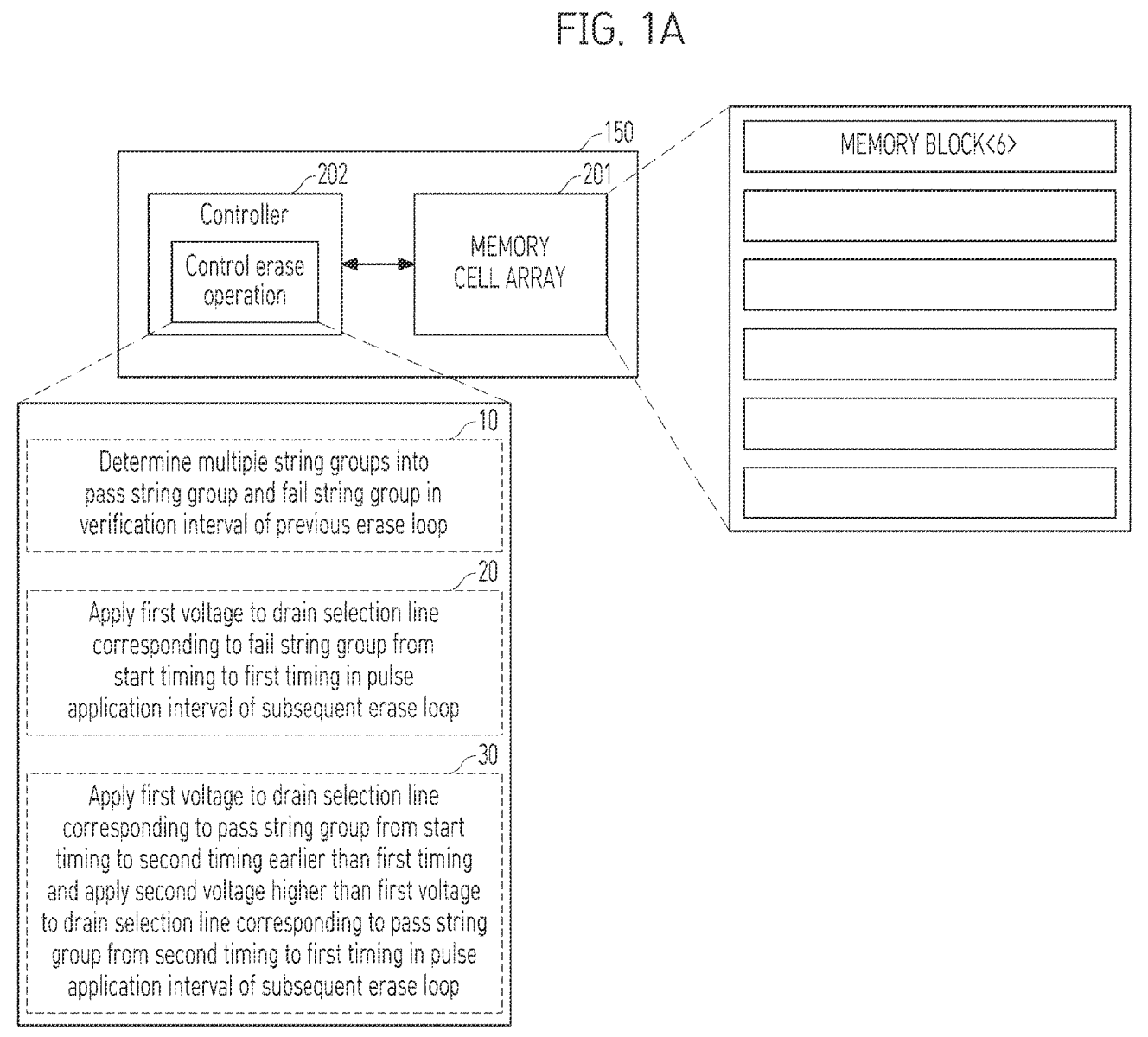

MEMORY BLOCK<6>

150

201

MEMORY CELL ARRAY

202

Controller

Control erase operation

10

Determine multiple string groups into pass string group and fail string group in verification interval of previous erase loop

20

Apply first voltage to drain selection line corresponding to fail string group from start timing to first timing in pulse application interval of subsequent erase loop

30

Apply first voltage to drain selection line corresponding to pass string group from start timing to second timing earlier than first timing and apply second voltage higher than first voltage to drain selection line corresponding to pass string group from second timing to first timing in pulse application interval of subsequent erase loop

MEMORY DEVICE FOR SUPPORTING EFFICIENT ERASE OPERATION AND OPERATING METHOD OF MEMORY DEVICE

CROSS-REFERENCE TO RELATED APPLICATION

This application claims priority under 35 U.S.C. § 119 to Korean Patent Application No. 10-2023-0141503 filed on Oct. 20, 2023, which is incorporated herein by reference in its entirety.

BACKGROUND

1. Field

Various embodiments of the present disclosure relate to a memory system, and particularly, to a memory device for supporting an efficient erase operation and an operating method of the memory device.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include a static random access memory (SRAM), a dynamic RAM (DRAM), a synchronous DRAM (SDRAM), etc. The nonvolatile memory device is a memory device in which data stored therein is retained even when a power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

A cell of a nonvolatile memory device is an element on which a program and erase (program/erase) operation may be performed. The nonvolatile memory device may perform program and erase operations on the cell by changing the threshold voltage of the cell as electrons are moved by a strong electric field applied to a thin oxide film of the cell.

A gate-induced drain leakage (GIDL) programming method and an incremental step pulse erase (ISPE) method may be used for an erase operation for multiple memory cells included in a nonvolatile memory device. The GIDL programming method includes changing a memory cell having a program state into the memory cell having an erase state by raising the potential level of the channel of a memory block that has been selected as an erase target through an erase voltage that has a high level and that is applied to the substrate of the selected memory block. The ISPE method includes increasing the voltage level of an erase voltage step by step that is applied to the substrate of a memory block that has been selected as an erase target.

SUMMARY

Various embodiments of the present disclosure are directed to providing a memory device capable of adjusting whether to perform an erase operation using a gate-induced drain leakage (GIDL) programming method and an incremental step pulse erase (ISPE) method for each string when performing the erase operation on a memory block having a three-dimensional structure and including multiple strings, and an operating method of the memory device.

Problems to be solved by the present disclosure are not limited to the above-mentioned problem, and the other unmentioned problems will be clearly understood from the following description by those skilled in the art.

An embodiment of the present disclosure includes a memory device that may include: a memory block comprising K string groups that are coupled to multiple bit lines through K drain selection lines, respectively, and that are coupled to a common source line through K source selection lines, respectively; and a controller configured to repeat one or more erase loops when an erase operation for the memory block is successful, each erase loop comprising a pulse application interval and a verification interval, configured to determine the K string groups as one of pass and fail string groups in a verification interval of a previous erase loop among the erase loops, and configured to apply a first voltage to a drain selection line corresponding to the fail string group from start timing to first timing, apply the first voltage to a drain selection line corresponding to the pass string group from the start timing to second timing earlier than the first timing, and apply a second voltage greater than the first voltage to the drain selection line from the second timing to the first timing in a pulse application interval of a subsequent erase loop among the erase loops, which is subsequent to the previous erase loop, wherein K may be a natural number greater than or equal to 2.

An embodiment of the present disclosure, includes an operating method of a memory device comprising K string groups that are coupled to multiple bit lines through K drain selection lines, respectively, and that are coupled to a common source line through K source selection lines, respectively, the operating method may include: an erase operation of repeating one or more erase loops until the erase operation for the memory block is successful, each erase loop comprising a pulse application interval and a verification interval; a determination operation of determining the K string groups as one of a pass string group and a fail string group in the verification interval of a previous erase loop, among erase loops that are repeated in the erase operation; a first application operation of applying a first voltage to a drain selection line corresponding to the fail string group that has been determined from start timing to first timing in the pulse application interval of a subsequent erase loop subsequent to the previous erase loop; and a second application operation of applying the first voltage to a drain selection line corresponding to the pass string group that has been determined from the start timing to second timing earlier than the first timing and applying a second voltage greater than the first voltage to the drain selection line corresponding to the pass string group from the second timing to the first timing, in the pulse application interval of the subsequent erase loop, wherein K may be a natural number greater than or equal to 2.

According to the present technology, an erase operation using the GIDL programming method and the ISPE method can be performed on a memory block having a three-dimensional structure and including multiple strings.

In particular, according to the present technology, an erase operation using the GIDL programming method can be applied to a corresponding memory block by checking an erase state for each string in a verification interval of a previous erase loop that is first performed, among erase loops that are repeated according to the ISPE method, and selecting each string in a pulse application interval of a subsequent erase loop that is performed subsequently to the previous erase loop based on a result of the check.

Accordingly, a phenomenon in which memory cells included in a string that has been determined to have an erase pass, which are excessively erased can be improved.

BRIEF DESCRIPTION OF THE DRAWINGS

FIGS. 1A and 1B are diagrams for describing a memory device according to an embodiment of the present disclosure.

DETAILED DESCRIPTION

Figure 1B:
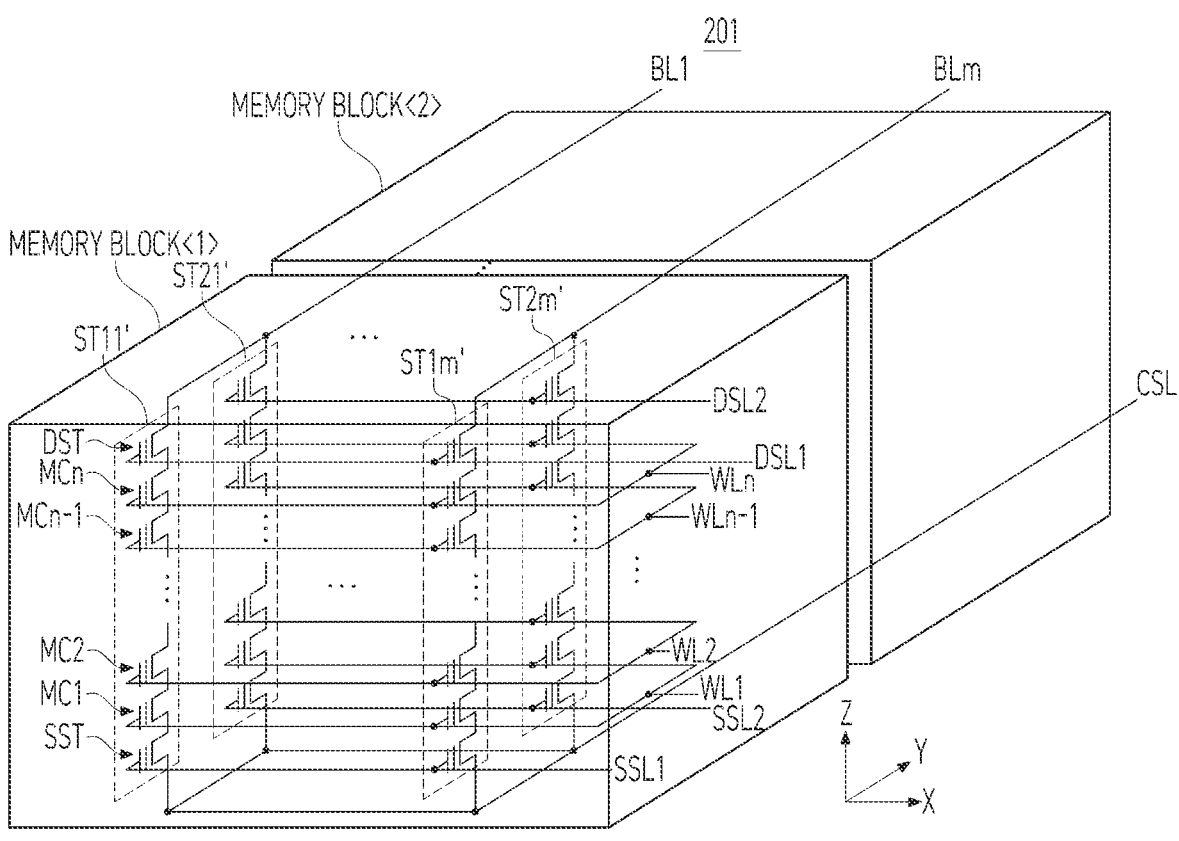

FIGS. 1A and 1B are diagrams for describing a memory device according to an embodiment of the present disclosure.

Figure 2:
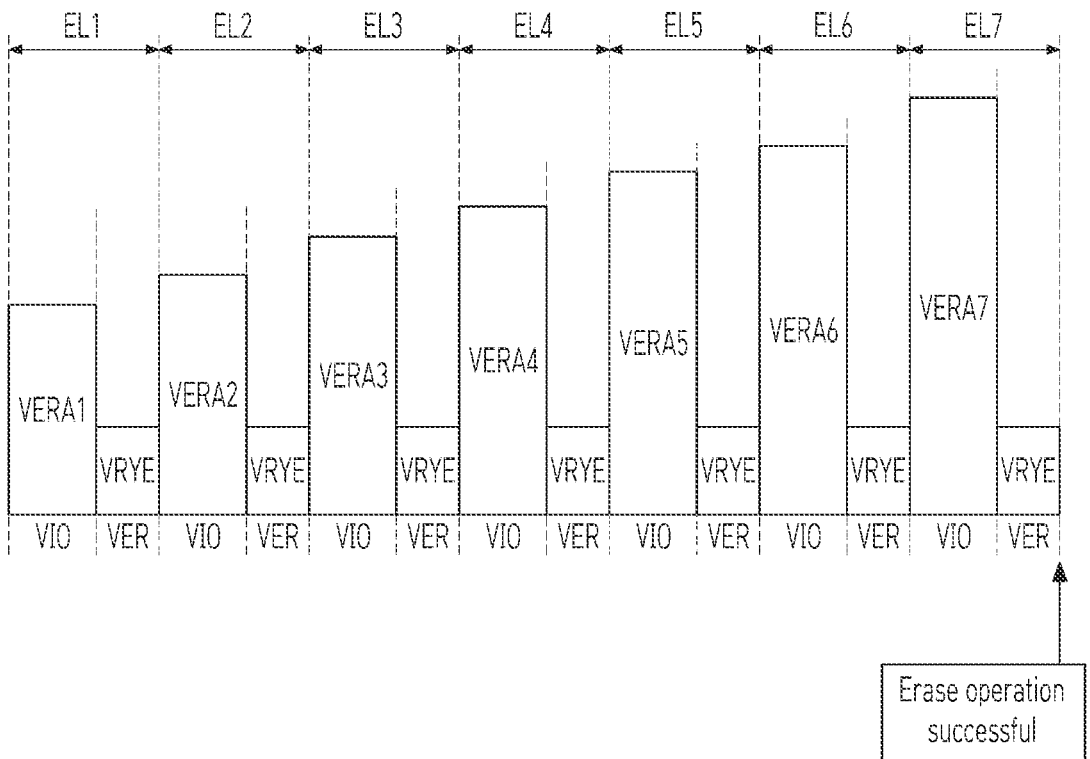
FIG. 2 is a diagram for describing an erase operation using the ISPE method, which is used in the memory device according to an embodiment of the present disclosure.

FIG. 2 is a diagram for describing an erase operation using the ISPE method, which is used in the memory device according to an embodiment of the present disclosure.

Referring to FIGS. 1A and 1B, a memory device 150 according to an embodiment of the present disclosure may include a memory cell array 201 and a controller 202.

The memory cell array 201 may include a plurality of memory blocks, e.g., MEMORY BLOCK<1:6>. Each of the memory blocks MEMORY BLOCK<1:6> may include a plurality of memory cells. One memory block may include a plurality of pages.

A memory block may be understood as a group of non-volatile memory cells from which data are removed together through the erase operation. Each of the memory blocks may include one or more pages in which the non-volatile memory cells are grouped, from a logical point of view, such as storing of data together during the program operation or outputting of data together during the read operation. For example, one memory block may include a plurality of pages. One page may include a plurality of non-volatile memory cells.

From a physical point of view different from the logical point of view such as the program operation or the read operation, one memory block may include a plurality of word lines. One word line may include a plurality of non-volatile memory cells.

In this case, one word line may correspond to at least one page according to the number of bits that can be stored or expressed in one non-volatile memory cell. For example, when one non-volatile memory cell is a single level cell (SLC) storing one bit of data, one word line may correspond to one page. When one non-volatile memory cell is a double level cell (DLC) storing two bits of data, one word line may correspond to two pages. When one non-volatile memory cell is a triple level cell (TLC) storing three bits of data, one word line may correspond to three pages. When one non-volatile memory cell is a quadruple level cell (QLC) storing four bits of data, one word line may correspond to four pages. In this way, when one non-volatile memory cell is a multiple level cell storing five or more bits of data, one word line may correspond to five or more pages. As described above, one word line may correspond to at least one page. Accordingly, in an embodiment of the present disclosure, an operation of selecting at least one logical page through an operation of selecting one word line will be described as an operation of selecting one physical page.

More specifically, each of the memory blocks MEMORY BLOCK<1:6> may include a 3-D structure. For example, each of the memory blocks MEMORY BLOCK<1:6> may include multiple memory cells that are stacked on a substrate. Accordingly, each of the memory blocks may be arranged in a +X direction, a +Y direction, and a +Z direction.

Referring to FIG. 1B, each of the memory blocks MEMORY BLOCK<1:6> may include a plurality of strings ST11' to ST1$m$' and ST21' to ST2$m$'. Each of the plurality of strings ST11' to ST1$m$' and ST21' to ST2$m$' may be extended along the vertical direction (Z direction). In the memory blocks MEMORY BLOCK<1:6>, m strings may be arranged in the row direction (X direction). In FIG. 1B, two strings are arranged in the column direction (Y direction), but this is for clarity; three or more strings may be arranged in the column direction (Y direction). Here, m may be a natural number of 2 or more.

Each of the plurality of strings ST11' to ST1$m$' and ST21' to ST2$m$' may include at least one source select transistor SST, first to n-th memory cells MC1 to MCn, and at least one drain select transistor DST. Here, n may be a natural number of 1 or more.

The source select transistor SST of each string may be connected between the common source line CSL and the memory cells MC1 to MCn. The source select transistors of the strings arranged in the same row may be connected to the same source select line. The source select transistors of the strings ST11' to ST1$m$' arranged in the first row may be connected to a first source select line SSL1. The source select transistors of the strings ST21' to ST2$m$' arranged in the second row may be connected to a second source select line SSL2. In another embodiment, the source select transistors of the strings ST11' to ST1$m$ 'and ST21' to ST2$m$' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

In an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory blocks MEMORY BLOCK<1:6> may be improved.

The drain select transistor DST of each string may be connected between the bit line BL and the memory cells MC1 to MCn. The drain select transistors DST of the strings arranged in the row direction may be connected to the drain select line extending in the row direction. The drain select transistors DST of the strings ST11' to ST1$m$' of the first row may be connected to a first drain select line DSL1. The drain select transistors DST of the strings ST21' to ST2$m$' of the second row may be connected to a second drain select line DSL2.

The strings arranged in the column direction may be connected to the bit lines extending in the column direction. In FIG. 1B, the strings ST11' and ST21' of a first column may be connected to the first bit line BL1. The strings ST1$m$' and ST2$m$' of an m-th column may be connected to the m-th bit line BLm.

Among the strings arranged in the row direction, the memory cells connected to the same word line may configure one physically page. For example, the memory cells connected to the first word line WL1 among the strings ST11' to ST1$m$' of the first row may configure one physically page. The memory cells connected to the first word line WL1 among the strings ST21' to ST2$m$' of the second row may configure another physically page. The strings arranged in one row direction are selected by selecting one of the drain select lines DSL1 and DSL2. One physically page of the selected strings is selected by selecting one of the word lines WL1 to WLn.

In an embodiment of the present disclosure, strings that are connected to the drain selection lines DSL1 to DSL2 and the source selection lines SSL1 to SSL2 in common, among strings arranged in the row direction, will be named a "string group". According to an embodiment, the strings ST11' to ST1$m$' in a first row, which are connected to the first drain selection line DSL1 and the first source selection line SSL1 in common, may be named a "first string group", and may be defined as reference numeral "ST1". Furthermore, the strings ST21' to ST2$m$' in a second row, which are connected to the second drain selection line DSL2 and the second source selection line SSL2 in common, may be named a "second string group", and may be defined as reference numeral "ST2". For reference, in the drawing, the two string groups ST1 and ST2 are included in each of the multiple memory blocks MEMORY BLOCK<1:6>, but this is merely an embodiment. Two or more string groups may be included in each of the multiple memory blocks MEMORY BLOCK<1:6>.

Referring back to FIG. 1A, the controller 202 may control an erase operation of erasing data stored in a selected memory block, among the multiple memory blocks MEMORY BLOCK<1:6> included in the memory cell array 201.

The controller 202 may use the GIDL programming method and the ISPE method. The GIDL programming method includes changing a memory cell having a program state into the memory cell having an erase state by selecting a memory block, among the multiple memory blocks MEMORY BLOCK<1:6> included in the memory cell array 201, as an erase target memory block (hereinafter referred to as an "erase selection block") and then raising the potential level of the channel of the erase selection block through an erase voltage that has a high level and is applied to the substrate of the erase selection block. The ISPE method includes increasing the voltage level of an erase voltage that is applied to the substrate of an erase selection block step by step.

In this case, an erase operation using the GIDL programming method may be an operation of changing the memory cell having the program state, among multiple memory cells included in the erase selection block, into the memory cell having the erase state by detrapping electrons that have been stored in the charge storage layer of the memory cell having the program state through a high potential level of the channel and a low potential level of a corresponding word line. The erase operation using the GIDL programming method is an already known operation, and will be no longer described in detail.

Referring to FIGS. 1A to 2, the erase operation may include multiple erase loops EL1 to EL7. That is, the controller 202 may repeatedly perform the multiple erase loops EL1 to EL7 one by one according to a set sequence until the erase operation for an erase selection block is completed. In this case, the controller 202 may treat the erase operation as a fail when the erase operation is not successful within a preset number of erase loops.

In the illustrated embodiment of FIG. 2, the erase operation is successful at a timing at which the seventh erase loop EL7, among the multiple erase loops EL1 to EL7, is completed. That is, all multiple memory cells included in an erase selection block have an erase state at the timing at which the seventh erase loop EL7, among the multiple erase loops EL1 to EL7, is completed.

In this case, each of the multiple erase loops EL1 to EL7 may include a pulse application interval VIO and a verification interval VER. The pulse application interval VIO is performed to change cells having a program state, among the multiple memory cells included in the erase selection block, into cells having the erase state. The pulse application interval VIO is performed by applying erase voltages VERA<1:7> to the common source line CSL and the multiple bit lines BL<1:m> in the state in which a ground voltage has been applied to the multiple word lines WL<1: n> that are connected to the erase selection block. The verification interval VER is performed to verify whether the cells having the program state, among the multiple memory cells included in the erase selection block, have been changed into the cells having the erase state. The verification interval VER is performed by applying an erase verification voltage VRYE to the multiple word lines WL<1:n> that are connected to the erase selection block.

In some embodiments, the potential levels of the erase voltages VERA<1:7> may be increased according to the ISPE method whenever the multiple erase loops EL1 to EL7 are repeated in the erase operation. In this case, the application number, pulse level, and pulse application time of each of the erase voltages VERA<1:7> that are used in the multiple erase loops EL1 to EL7, respectively, may be adjusted in various forms.

More specifically, the controller 202 according to an embodiment of the present disclosure may verify whether each of the multiple string groups ST1 and ST2 included in the erase selection block is an erase pass or fail in the verification interval VER of each of the multiple erase loops EL1 to EL7 that are repeated in the erase operation. That is, the controller 202 may determine the multiple string groups ST1 and ST2 included in the erase selection block as one of a pass string group and a fail string group in the verification interval VER of each of the multiple erase loops EL1 to EL7 that are repeated in the erase operation (FIG. 1A, 10).

For example, the controller 202 may determine, as a fail string group, a string group in which the number of memory cells checked as an erase pass in the verification interval VER, among memory cells that are connected to each of the multiple string groups ST1 and ST2 included in the erase selection block, is less than a first reference number. Further, the controller 202 may determine the remaining string group as a pass string group.

More specifically, the controller 202 may perform an operation of sensing the amount of a voltage or current that is loaded onto the multiple bit lines BL<1:m> in the state in which the erase verification voltage VRYE has been applied to the multiple word lines WL<1:n> that are included in the erase selection block in the verification interval VER of each of the multiple erase loops EL1 to EL7 that are repeated in the erase operation. In this case, the controller 202 may determine whether each of the multiple string groups ST1 and ST2 is an erase pass through a method of repeating, by the number of multiple string groups ST1 and ST2, a method of sensing the amount of a voltage or current that is loaded onto the multiple bit lines BL<1:m> in the state in which one of the multiple string groups ST1 and ST2 included in the erase selection block has been selected. In this case, the controller 202 may determine whether each of the multiple string groups ST1 and ST2 included in the erase selection block has been erased by selecting each of the multiple string groups ST1 and ST2 once according to a set sequence in one verification interval VER of each of the multiple erase loops EL1 to EL7. Furthermore, the controller 202 may skip a determination of whether each of the multiple string groups ST1 and ST2 included in the erase selection block has been erased depending on the state of each of the multiple string groups ST1 and ST2. That is, the controller 202 may skip a determination of whether a string group checked as an erase pass in the verification interval VER of a previous erase loop that has been previously performed, among the multiple erase loops EL1 to EL7, has been erased in the verification interval VER of a subsequent erase loop that is subsequently performed.

For reference, it may be seen from FIG. 2 that the multiple erase loops EL1 to EL7 included in the erase operation are determined as one of a "preceding" erase loop and a "subsequent" erase loop. In this case, a relation between the previous erase loop and the subsequent erase loop may mean a relation between an erase loop that is first performed and an erase loop that is subsequently performed in succession to the erase loop that has been previously performed. For example, if a first erase loop EL1 is a previous erase loop, a subsequent erase loop may mean a second erase loop EL2 that is performed subsequently to the first erase loop EL1, and might not mean a third erase loop to a seventh erase loop EL3 to EL7 that are performed after the second erase loop EL2. If the sixth erase loop EL6 is a previous erase loop, the seventh erase loop EL7 that is performed subsequently to the sixth erase loop EL6 may be a subsequent erase loop. Accordingly, the first erase loop EL1 that is first performed, among the multiple erase loops EL1 to EL7, might not become a subsequent erase loop. The seventh erase loop EL7 that has been finally performed might not become a previous erase loop.

According to an embodiment, two or more erase pass groups are included in an erase selection block. For example, a previous erase loop, among multiple erase loops, is the third erase loop EL3 and a subsequent erase loop subsequent to the third erase loop EL3 is the fourth erase loop EL4. In such a case, the controller 202 may first determine whether the first string group ST1 included in an erase selection block is an erase pass and then determine whether the second string group ST2 included in the erase selection block is an erase pass in the verification interval VER of the third erase loop EL3, among the multiple erase loops EL1 to EL7. If the first string group ST1 has been determined to have an erase pass state in the verification interval VER of the third erase loop EL3, the controller 202 may skip an operation of determining whether the first string group ST1 is an erase pass in the fourth erase loop EL4 subsequent to the third erase loop EL3. That is, if the second string group ST2 has been determined to have an erase pass state in the verification interval VER of the third erase loop EL3, the controller 202 may perform an operation of directly determining whether the second string group ST2 is an erase pass, without performing an operation of first determining whether the first string group ST1 is an erase pass in the fourth erase loop EL4 subsequent to the third erase loop EL3.

As described above, the controller 202 may determine the multiple string groups ST1 and ST2 included in the erase selection block as one of pass and fail string groups in the verification interval VER of a previous erase loop, among the multiple erase loops EL1 to EL7 that are repeated in the erase operation (FIG. 1A, 10). The controller 202 may then differently set a voltage that is applied to the drain selection line DSL corresponding to the pass string group and a voltage that is applied to the drain selection line DSL corresponding to the fail string group in the pulse application interval VIO of a subsequent erase loop that is subsequent to the previous erase loop (FIGS. 1A, 20 and 30).

More specifically, the controller 202 may apply a first voltage to the drain selection line DSL corresponding to the fail string group from start timing to first timing in the pulse application interval VIO of the subsequent erase loop (FIG. 1A, 20). Furthermore, the controller 202 might not apply any voltage to each of the multiple drain selection lines DSL<1: 2> from the first timing to end timing in the pulse application interval VIO of the subsequent erase loop in order to float the drain selection line DSL corresponding to the fail string group. For example, the first voltage may be a voltage Vesl of FIG. 3, which may be set to have the voltage level of a ground voltage or a lower voltage than the ground voltage.

In some embodiments, the controller 202 may apply the first voltage to the drain selection line DSL corresponding to the pass string group from the start timing to second timing earlier than the first timing and apply a second voltage greater than the first voltage to the drain selection line DSL corresponding to the pass string group from the second timing to the first timing, in the pulse application interval VIO of the subsequent erase loop (FIG. 1A, 30). Furthermore, the controller 202 might not apply any voltage to the drain selection line DSL corresponding to the fail string group from the first timing to the end timing in the pulse application interval VIO of the subsequent erase loop in order to float the drain selection line DSL corresponding to the fail string group.

In some embodiments, the controller 202 may apply the first voltage to the source selection line SSL corresponding to each of the multiple string groups from the start timing to the first timing in the pulse application interval VIO of the subsequent erase loop. Further, the controller 202 might not apply any voltage to the source selection line SSL corresponding to each of the multiple string groups from the first timing to the end timing in order to float the source selection line SSL corresponding to each of the multiple string groups.

In some embodiments, the controller 202 may apply an erase operation voltage, for example, the ground voltage to all of the word lines included in the erase selection block in the pulse application interval VIO of the subsequent erase loop, that is, from the start timing to the end timing.

In some embodiments, the controller 202 may determine the multiple string groups as one of pass and fail string groups in the verification interval VER of a previous erase loop, and may then check the strength of the erase pass of the pass string group.

In some embodiments, the controller 202 may determine, as a fail string group, a string group in which the number of memory cells checked as an erase pass in the verification interval VER, among memory cells that are connected to each of the multiple string groups ST1 and ST2 included in an erase selection block, is less than a first reference number. Further, the controller 202 may determine, as a pass string group, a string group in which the number of memory cells checked as an erase pass in the verification interval VER, among the memory cells that are connected to each of the multiple string groups ST1 and ST2 included in the erase selection block, is the first reference number or more. Furthermore, the controller 202 may simultaneously determine, as a weak pass string group, a string group in which the number of memory cells included in the pass string group is the first reference number or more and less than a second reference number, and determine, as a strong pass string group, a string group in which the number of memory cells included in the pass string group is the second reference number or more. In this case, the second reference number may be greater than the first reference number.

In some embodiments, the controller 202 may change a time difference between "second timing" and "first timing" in the pulse application interval VIO of a subsequent erase loop based on the strength of the erase pass of the pass string group. The strength of the erase pass of the pass string group may be checked in the verification interval VER of a previous erase loop. The second timing may be a timing at which the second voltage starts to be applied to the drain selection line DSL corresponding to the pass string group, in the pulse application interval VIO of the subsequent erase loop. The first timing may be a timing at which the drain selection line DSL is floated, in the pulse application interval VIO of the subsequent erase loop.

In some embodiments, the controller 202 may set the second timing and the first timing so that the second timing and the first timing have a "first time" difference, that is, so that the second timing is earlier than the first timing by the first time, with respect to the drain selection line DSL corresponding to a strong pass string group in which the strength of the erase pass of the pass string group, which is checked in the verification interval VER of a previous erase loop, is a reference value or more. Furthermore, the controller 202 may set the second timing and the first timing so that the second timing and the first timing have a "second time" difference, that is, so that the second timing is earlier than the first timing by the second time, with respect to the drain selection line DSL corresponding to a weak pass string group in which the strength of the erase pass of the pass string group, which is checked in the verification interval VER of a previous erase loop, is less than the reference value. In this case, the first time may be a time longer than the second time.

That is, the controller 202 may set the timing at which the second voltage is applied to the drain selection line DSL corresponding to the strong pass string group to be earlier than the timing at which the second voltage is applied to the drain selection line DSL corresponding to the weak pass string group.

In the aforementioned description, an operation of "applying" a specific voltage to a specific line may mean an operation of "driving" the specific voltage to a specific line. That is, applying the specific voltage to the specific line may mean the state in which the specific line maintains a specific voltage level by driving the specific voltage to the specific line so that the voltage level of the specific line is not changed due to a phenomenon, such as a coupling effect.

Figure 3:
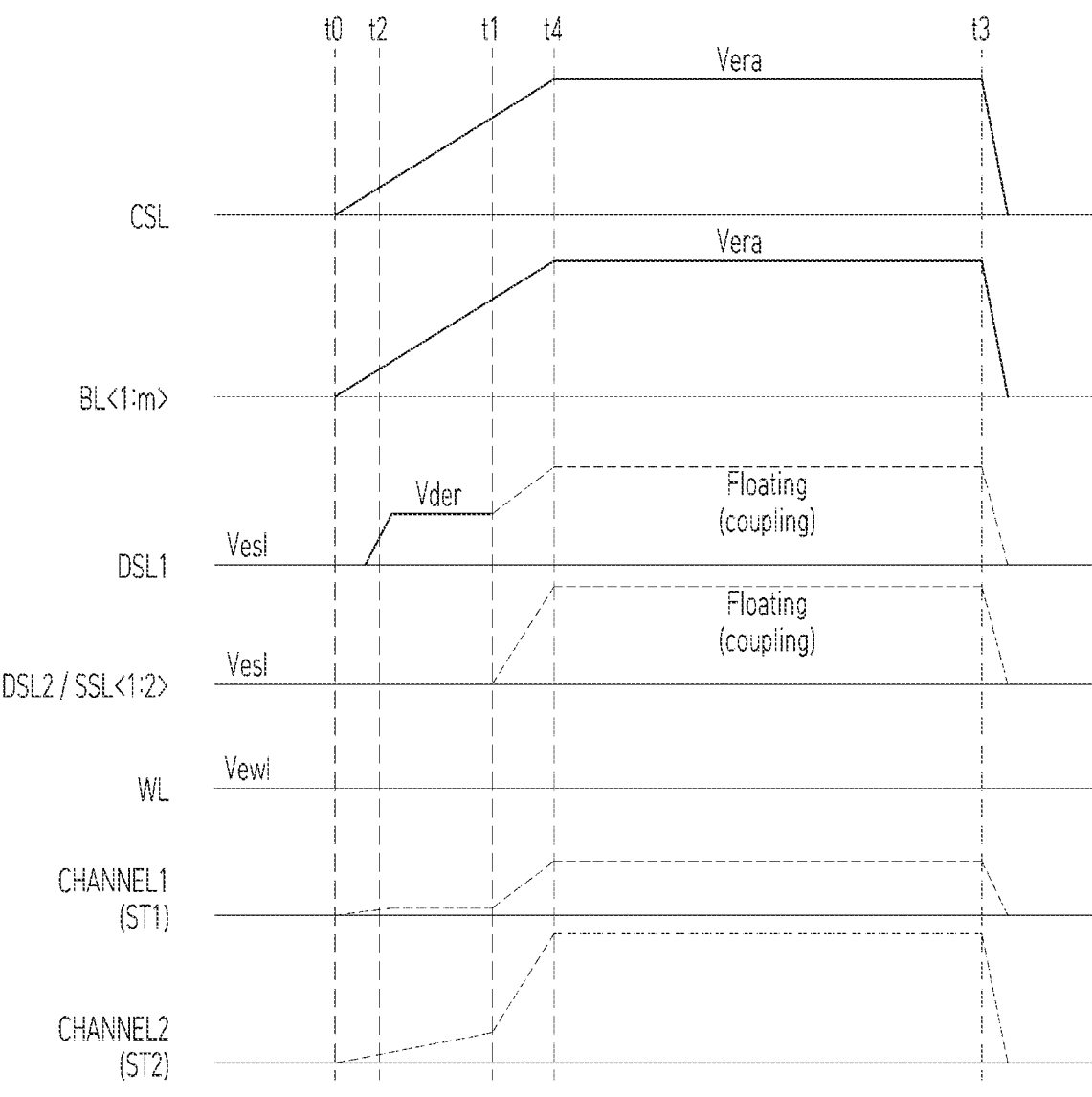
FIG. 3 is a diagram for describing an erase operation that is performed in the memory device according to an embodiment of the present disclosure.

FIG. 3 is a diagram for describing an erase operation that is performed in the memory device according to an embodiment of the present disclosure.

Referring to FIG. 3, an example of the pulse application interval VIO that is included in a subsequent erase loop included in an erase operation that is performed in the memory device according to an embodiment of the present disclosure will be described. FIG. 3 corresponds to that the two string groups ST1 and ST2 are included in each of the multiple memory blocks MEMORY BLOCK<1:6>.

Specifically, in FIG. 3, the controller 202 may have determined the state in which the first string group ST1 is an erase pass and the second string group ST2 is an erase fail in the verification interval VER of a previous erase loop. That is, the controller 202 may have checked the state in which the number of memory cells checked as an erase pass in the verification interval VER of the previous erase loop, among memory cells that are connected to the first string group ST1, is a first reference number or more, and the number of memory cells checked as an erase pass in the verification interval VER of the previous erase loop, among memory cells that are connected to the second string group ST2, is less than the first reference number. Accordingly, the controller 202 may perform an operation for the pulse application interval VIO of a subsequent erase loop in the state in which the first string group ST1 has been determined as a pass string group and the second string group ST2 has been determined as a fail string group.

The controller 202 may apply an erase voltage Vera to the multiple bit lines BL<1:m> and the common source line CSL from start timing t0 to end timing t3 in the pulse application interval VIO of the subsequent erase loop. In this case, the controller 202 may need to perform a pumping operation in order to generate the erase voltage Vera because the erase voltage Vera has a higher voltage level than a power source that is supplied from the outside. Accordingly, the erase voltage Vera may have a form in which the voltage level of the erase voltage rises toward a target level of the erase voltage from the start timing t0 to rising timing t4 and may have a form in which the erase voltage maintains the target level from the rising timing t4 to the end timing t3.

The controller 202 may apply, to the multiple word lines WL<1:n>, an erase word line voltage Vewl set to have the voltage level of the ground voltage or a lower voltage than the ground voltage from the start timing t0 to the end timing t3 in the pulse application interval VIO of the subsequent erase loop.

The controller 202 may minimize the drop of the threshold voltage levels of the memory cells that are connected to the first string group ST1 determined as the pass string group and drop only the threshold voltage levels of the memory cells that are connected to the second string group ST2 determined as the fail string group in the pulse application interval VIO of the subsequent erase loop.

More specifically, the controller 202 may apply a first voltage Vesl to the second drain selection line DSL2 and the second source selection line SSL2 corresponding to the second string group ST2 that has been determined as the fail string group in the verification interval VER of the previous erase loop from the start timing t0 to first timing t1. Further, the controller 202 may float the second drain selection line DSL2 and the second source selection line SSL2 from the first timing t1 to the end timing t3, in the pulse application interval VIO of the subsequent erase loop. In this case, the first voltage Vesl may be set to have the voltage level of the ground voltage or a lower voltage than the ground voltage.

In this case, the controller 202 may set the first timing t1 to be earlier than the rising timing t4. For this reason, the levels of the second drain selection line DSL2 and the second source selection line SSL2 may rise due to coupling based on the rising of the levels of the multiple bit lines BL<1:m> and the common source line CSL up to the voltage level of the erase voltage Vera between the first timing t1 and the rising timing t4.

In some embodiments, the voltage level of the second channel CHANNEL2 corresponding to the second string group ST2 may rise because a GIDL current is generated in accordance with the rising of the voltage level of the erase voltage Vera that is applied to the multiple bit lines BL<1:m> and the common source line CSL in the pulse application interval VIO of the subsequent erase loop. At this time, the voltage level of the second channel CHANNEL2 may rise at a first scheduled slope in accordance with the application of the first voltage Vesl to the second drain selection line DSL2 and the second source selection line SSL2 by the controller 202 from the start timing t0 to the first timing t1 in the pulse application interval VIO of the subsequent erase loop. Next, the voltage level of the second channel CHANNEL2 may also rise in accordance with the rising of the levels of the second drain selection line DSL2 and the second source selection line SSL2 that have been floated at the first timing t1 due to the coupling effect. As the voltage level of the second channel CHANNEL2 rises as described above, the threshold voltage levels of the memory cells that are connected to the second string group ST2 may drop from the rising timing t4 to the end timing t3. That is, as the voltage level of the second channel CHANNEL2 rises in the state in which the erase word line voltage Vewl set to have the voltage level of the ground voltage or a lower voltage than the ground voltage has been applied to the multiple word lines WL<1:n> from the rising timing t4 to the end timing t3, electrons that have been stored in the charge storage layers of the memory cells that are connected to the second string group ST2 may be detrapped by the high voltage level of the second channel CHANNEL2.

In some embodiments, how much is the first timing t1 set to be earlier than the rising timing t4 may be predetermined depending on the type of memory device 150 or the characteristics of an operation of the memory device 150.

In some embodiments, in the pulse application interval VIO of the subsequent erase loop, the controller 202 may apply the first voltage Vesl to the first drain selection line DSL1 corresponding to the first string group ST1 that has been determined as the pass string group in the verification interval VER of the previous erase loop from the start timing t0 to second timing t2 earlier than the first timing t1. Further, the controller 202 may apply a second voltage Vder higher than the first voltage Vesl to the first drain selection line DSL1 corresponding to the first string group ST1 from the second timing t2 to the first timing t1. Further, the controller 202 may float the first drain selection line DSL1 from the first timing t1 to the end timing t3. Furthermore, in the pulse application interval VIO of the subsequent erase loop, the controller 202 may apply the first voltage Vesl to the first source selection line SSL1 corresponding to the first string group ST1 from the start timing t0 to the first timing t1, and float the first source selection line SSL1 from the first timing t1 to the end timing t3.

In this case, the controller 202 may set the first timing t1 to be earlier than the rising timing t4, and may set the second timing t2 to be earlier than the first timing t1. Accordingly, the first drain selection line DSL1 may be set to have the voltage level of the first voltage Vesl at the start timing t0, may then rise to the voltage level of the second voltage Vder at the second timing t2, and may rise from the voltage level of the second voltage Vder due to coupling based on the rising of the multiple bit lines BL<1:m> and the common source line CSL to the voltage level of the erase voltage Vera between the first timing t1 and the rising timing t4. As described above, the first drain selection line DSL1 may be in the state in which the voltage level of the first drain selection line DSL1 has already risen to the voltage level of the second voltage Vder higher than the first voltage Vesl at the second timing t2 earlier than the first timing t1, and the second drain selection line DSL2 may be in the state in which the second drain selection line DSL2 continues to maintain the voltage level of the first voltage Vesl up to the first timing t1. Accordingly, it may be seen that the width of the second drain selection line DSL2 is greater than the width of the first drain selection line DSL1. Here, the voltage level of the second drain selection line DSL2 rises due to the coupling effect between the first timing t1 and the rising timing t4, and the voltage level of first drain selection line DSL1 rises due to the coupling effect between the first timing t1 and the rising timing t4.

Similarly to the second channel CHANNEL2 corresponding to the second string group ST2, the voltage level of the first channel CHANNEL1 corresponding to the first string group ST1 may rise because a GIDL current is generated in accordance with the rising of the voltage level of the erase voltage Vera that is applied to the multiple bit lines BL<1:m> and the common source line CSL in the pulse application interval VIO of the subsequent erase loop.

However, in the pulse application interval VIO of the subsequent erase loop, the controller 202 applies the first voltage Vesl to the first drain selection line DSL1 only from the start timing t0 to the second timing t2, and applies the second voltage Vder to the first drain selection line DSL1 from the second timing t2 to the first timing t1. Accordingly, the voltage level of the first channel CHANNEL1 may rise at the first scheduled slope only between the start timing t0 and the second timing t2, and may rise at a second scheduled slope between the second timing t2 and the first timing t1. In this case, the second scheduled slope may be smaller than the first scheduled slope. The first channel CHANNEL1 may be in the state in which the voltage level of the first channel CHANNEL1 is lower than the voltage level of the second channel CHANNEL2 at the first timing t1 because the voltage level of the second channel CHANNEL2 continues to rise at the first scheduled slope between the start timing t0 and the first timing t1.

Next, the voltage level of the first channel CHANNEL1 may also rise in accordance with the rising of the voltage level of the first drain selection line DSL1 that has been floated at the first timing t1 due to the coupling effect. At this time, the width of the first drain selection line DSL1 may be smaller than the width of the second drain selection line DSL2 because the first drain selection line DSL1 is in the state in which the first drain selection line DSL1 has the voltage level of the second voltage Vder higher than the voltage level of the first voltage Vesl and the second drain selection line DSL2 is in the state in which the second drain selection line DSL2 has the voltage level of the first voltage Vesl at the first timing t1. Here, the voltage level of the first drain selection line DSL1 rises from the first timing t1 to the rising timing t4, and the voltage level of the second drain selection line DSL2 rises from the first timing t1 to the rising timing t4. That is, the width of the first channel CHANNEL1 may be smaller than the width of the second channel CHANNEL2. Here, the voltage level of the first channel CHANNEL1 rises from the first timing t1 to the rising timing t4, and the voltage level of the second channel CHANNEL2 rises from the first timing t1 to the rising timing t4.

As described above, the first channel CHANNEL1 may be in the state in which the voltage level of the first channel CHANNEL1 is lower than the voltage level of the second channel CHANNEL2 at the first timing t1, and the width of the first channel CHANNEL1 may be smaller than the width of the second channel CHANNEL2. Here, the voltage level of the first channel CHANNEL1 rises from the first timing t1 to the rising timing t4, and the voltage level of the second channel CHANNEL2 rises from the first timing t1 to the rising timing t4. Accordingly, the voltage level of the second channel CHANNEL2 may rise up to a level to the extent that the threshold voltage levels of the memory cells that are connected to the second string group ST2 can drop between the first timing t1 and the rising timing t4. In contrast, the voltage level of the first channel CHANNEL1 might not rise to the extent that the threshold voltage levels of the memory cells that are connected to the first string group ST1 can drop. That is, the first channel CHANNEL1 may be in the state in which the erase word line voltage Vewl set to have the voltage level of the ground voltage or a lower voltage than the ground voltage has been applied to the multiple word lines WL<1:n> from the rising timing t4 to the end timing t3, but may be in the state in which the voltage level of the first channel CHANNEL1 has not sufficiently risen. Accordingly, the detrapping of electrons that have been stored in the charge storage layers of the memory cells that are connected to the first string group ST1 can be minimized.

As shown in FIG. 3, the controller 202 may raise the voltage level of the first drain selection line DSL1 from the voltage level of the first voltage Vesl to the voltage level of the second voltage Vder at the second timing t2 in the pulse application interval VIO of the subsequent erase loop, but may continue to maintain the voltage level of the first source selection line SSL1 to the voltage level of the first voltage Vesl from the start timing t0 to the first timing t1. That is, the controller 202 can minimize the drop of the threshold voltage levels of the memory cells that are connected to the first string group ST1 determined as the pass string group through only control of the voltage level of the first drain selection line DSL1 in the pulse application interval VIO of the subsequent erase loop. The reason why such an operation is possible is that a phenomenon in which the voltage level of a channel is changed by a GIDL current greatly occurs by a drain stage that is connected to the multiple bit lines BL<1:m>. Unlike in the aforementioned embodiment, it is possible to minimize the drop of the threshold voltage levels of the memory cells that are connected to the first string group ST1 determined as the pass string group through control of the voltage levels of the first drain selection line DSL1 and the first source selection line SSL1 in the pulse application interval VIO of the subsequent erase loop.

Figure 4A:
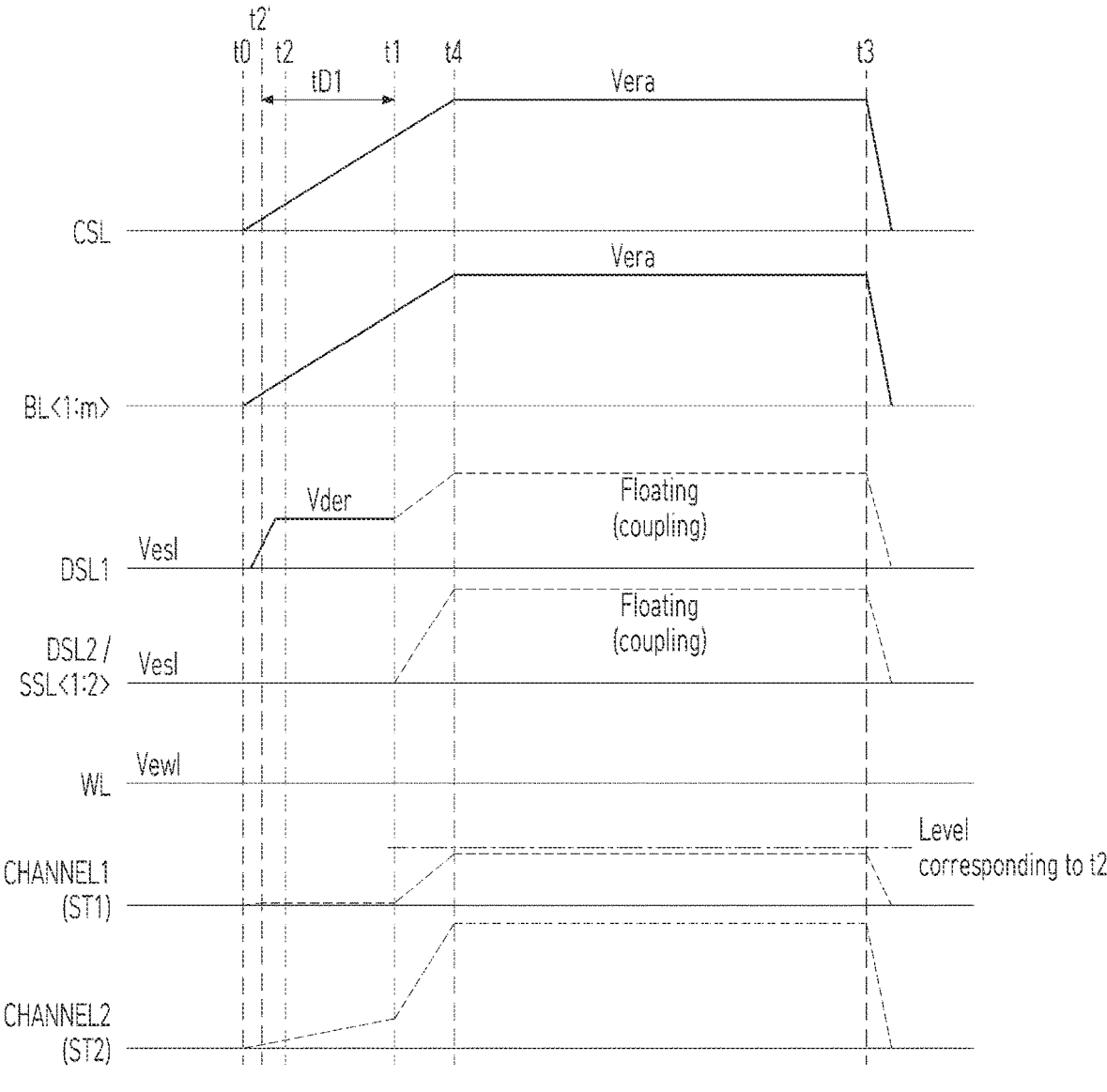
FIGS. 4A and 4B are diagrams for describing other erase operations that are performed in the memory device according to an embodiment of the present disclosure.
Figure 4B:
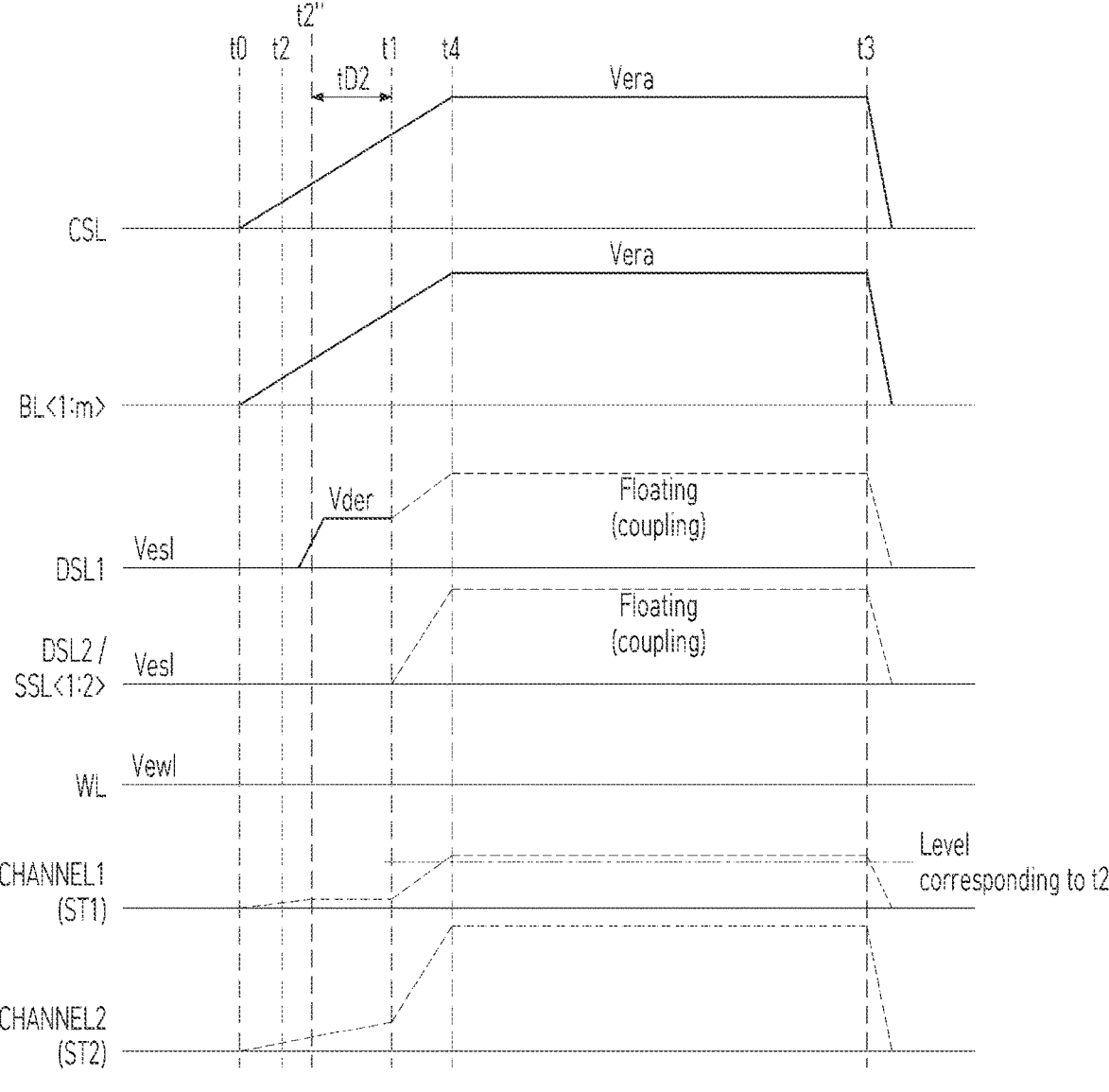

FIGS. 4A and 4B are diagrams for describing other erase operations that are performed in the memory device according to an embodiment of the present disclosure.

It may be seen that the erase operations illustrated in FIGS. 4A and 4B are almost similar to the erase operation illustrated in FIG. 3. Accordingly, only differences between the erase operations illustrated in FIGS. 4A and 4B and the erase operation illustrated in FIG. 3 will be described hereinafter.

In FIG. 3, the controller 202 has determined the first string group ST1 as a pass string group by checking that the number of memory cells checked as an erase pass in the verification interval VER of a previous erase loop, among the memory cells that are connected to the first string group ST1, is the first reference number or more, has determined the second string group ST2 as a fail string group by checking that the number of memory cells checked as an erase pass in the verification interval VER of the previous erase loop, among the memory cells that are connected to the second string group ST2, is less than the first reference number, and has performed the pulse application interval VIO of a subsequent erase loop.

Referring to FIG. 4A, the controller 202 may determine the first string group ST1 as a strong pass string group in the verification interval VER of a previous erase loop, and may perform an operation for the pulse application interval VIO of a subsequent erase loop in the state in which the second string group ST2 has been determined as a fail string group.

That is, the controller 202 may have checked the state in which the number of memory cells checked as an erase pass in the verification interval VER of the previous erase loop, among the memory cells that are connected to the first string group ST1, is a second reference number greater than the first reference number. Accordingly, the first string group ST1 may be in the state in which the first string group ST1 has been determined as a strong pass string group.

Accordingly, the controller 202 may set a time difference between second timing t2', that is, timing at which the second voltage Vder starts to be applied to the first drain selection line DSL1 corresponding to the first string group ST1 determined as the strong pass string group, and first timing t1, that is, timing at which the first drain selection line DSL1 is floated, as a first time tD1.

Comparing FIGS. 3 and 4A, it may be seen that the second timing t2' corresponding to a case in which the first string group ST1 has been determined as a "strong pass string group" is earlier than second timing t2 corresponding to a case in which the first string group ST1 has been determined as a "pass string group", that is, the second timing t2', has a longer time difference than the second timing t2 from the first timing t1.

As described above, if the controller 202 advances the timing at which the "second timing" starts (t2→t2') in the pulse application interval VIO of the subsequent erase loop interval, the length of an interval in which the voltage level of the first channel CHANNEL1 corresponding to the first string group ST1 determined as the "strong pass string group" rises at a first scheduled slope may be reduced, compared to the voltage level of the first channel CHANNEL1 corresponding to the first string group ST1 determined as the "pass string group". At the same time, the length of an interval in which the voltage level of the first channel CHANNEL1 corresponding to the first string group ST1 determined as the "strong pass string group" rises at a second scheduled slope may be increased. Accordingly, at the first timing t1, the voltage level of the first channel CHANNEL1 corresponding to the first string group ST1 determined as the "strong pass string group" may be more lowered than the voltage level of the first channel CHANNEL1 corresponding to the first string group ST1 determined as the "pass string group". Accordingly, at rising timing t4, the voltage level of the first channel CHANNEL1 corresponding to the first string group ST1 determined as the "strong pass string group" may be more lowered than the voltage level (i.e., a level corresponding to the second timing t2) of the first channel CHANNEL1 corresponding to the first string group ST1 determined as the "pass string group".

Accordingly, the ratio at which electrons stored in the charge storage layers of the memory cells that are connected to the first string group ST1 determined as the "strong pass string group" are detrapped may be lower than the ratio at which electrons stored in the charge storage layers of the memory cells that are connected to the first string group ST1 determined as the "pass string group" are detrapped between the rising timing t4 and end timing t3. That is, a degree that the threshold voltage levels of the memory cells that are connected to the first string group ST1 determined as the "strong pass string group" drop may be lower than a degree that the threshold voltage levels of the memory cells that are connected to the first string group ST1 determined as the "pass string group" drop.

Referring to FIG. 4B, the controller 202 may determine the first string group ST1 as a weak pass string group in the verification interval VER of a previous erase loop. Further, the controller 202 may perform an operation for the pulse application interval VIO of a subsequent erase loop in the state in which the second string group ST2 has been determined as a fail string group.

That is, the controller 202 may have checked the state in which the number of memory cells checked as an erase pass in the verification interval VER of the previous erase loop, among the memory cells that are connected to the first string group ST1, is less than the second reference number greater than the first reference number. Accordingly, the first string group ST1 may be in the state in which the first string group ST1 has been determined as a weak pass string group.

Accordingly, the controller 202 may set, as a second time tD2, a time difference between second timing t2" and first timing t1. The second timing t2" is timing at which second voltage Vder starts to be applied to the first drain selection line DSL1 corresponding to the first string group ST1 determined as the weak pass string group. The first timing t1 is timing at which the first drain selection line DSL1 is floated.

Comparing FIGS. 3 and 4B, it may be seen that the second timing t2" corresponding to a case in which the first string group ST1 has been determined as the "weak pass string group" is later than second timing t2 corresponding to a case in which the first string group ST1 has been determined as the "pass string group". That is, the second timing t2" has a shorter time difference than the second timing t2 from the first timing t1.

As described above, if the controller 202 pushes timing at which the "second timing" is started back (t2→t2") in the pulse application interval VIO of the subsequent erase loop interval, the length of an interval in which the voltage level of the first channel CHANNEL1 corresponding to the first string group ST1 determined as the "weak pass string group" rises at a first scheduled slope may be increased, compared to the voltage level of the first channel CHANNEL1 corresponding to the first string group ST1 determined as the "pass string group". At the same time, the length of an interval in which the voltage level of the first channel CHANNEL1 corresponding to the first string group ST1 determined as the "weak pass string group" rises at a second scheduled slope may be reduced. Accordingly, at the first timing t1, the voltage level of the first channel CHANNEL1 corresponding to the first string group ST1 determined as the "weak pass string group" may become higher than the voltage level of the first channel CHANNEL1 corresponding to the first string group ST1 determined as the "pass string group". Accordingly, at rising timing t4, the voltage level of the first channel CHANNEL1 corresponding to the first string group ST1 determined as the "weak pass string group" may become higher than the voltage level (i.e., a level corresponding to the second timing t2) of the first channel CHANNEL1 corresponding to the first string group ST1 determined as the "pass string group".

Accordingly, the ratio at which electrons stored in the charge storage layers of the memory cells that are connected to the first string group ST1 determined as the "weak pass string group" are detrapped may be greater than the ratio at which electrons stored in the charge storage layers of the memory cells that are connected to the first string group ST1 determined as the "pass string group" are detrapped between the rising timing t4 and end timing t3. That is, a degree that the threshold voltage levels of the memory cells that are connected to the first string group ST1 determined as the "weak pass string group" drop may be greater than a degree that the threshold voltage levels of the memory cells that are connected to the first string group ST1 determined as the "pass string group" drop.

Comparing FIGS. 4A and 4B, the controller 202 may set, as the first time tD1, the time difference between the second timing t2' and the first timing t1. The second timing t2' is the timing at which the second voltage Vder starts to be applied to the first drain selection line DSL1 corresponding to the first string group ST1 determined as the strong pass string group. The first timing t1 is the timing at which the first drain selection line DSL1 is floated. Further, the controller 202 may set, as the second time tD2, the time difference between the second timing t2" and the first timing t1. The second timing t2" is the timing at which the second voltage Vder starts to be applied to the first drain selection line DSL1 corresponding to the first string group ST1 determined as the weak pass string group. The first timing t1 is the timing at which the first drain selection line DSL1 is floated. In this case, it may be seen that the first time tD1 is longer than the second time tD2.

The controller 202 may change the time difference between the "second timing" and the "first timing". The "second timing" is the timing at which the second voltage starts to be applied to the drain selection line DSL corresponding to the pass string group. The "first timing" is the timing at which the drain selection line DSL is floated. The changing of the time difference may be performed by checking the strength of the erase pass of a pass string group checked in the verification interval VER of a previous erase loop, and changing the "second timing" in the pulse application interval VIO of a subsequent erase loop based on the checked strength of the erase pass.

That is, the controller 202 may set the timing at which second voltage is applied to the drain selection line DSL corresponding to a pass string group that is relatively strong so that the timing at which the second voltage is applied to the drain selection line DSL corresponding to the pass string group is relatively earlier than the timing at which the second voltage is applied to the drain selection line DSL corresponding to a weak pass string group.

Figure 5:
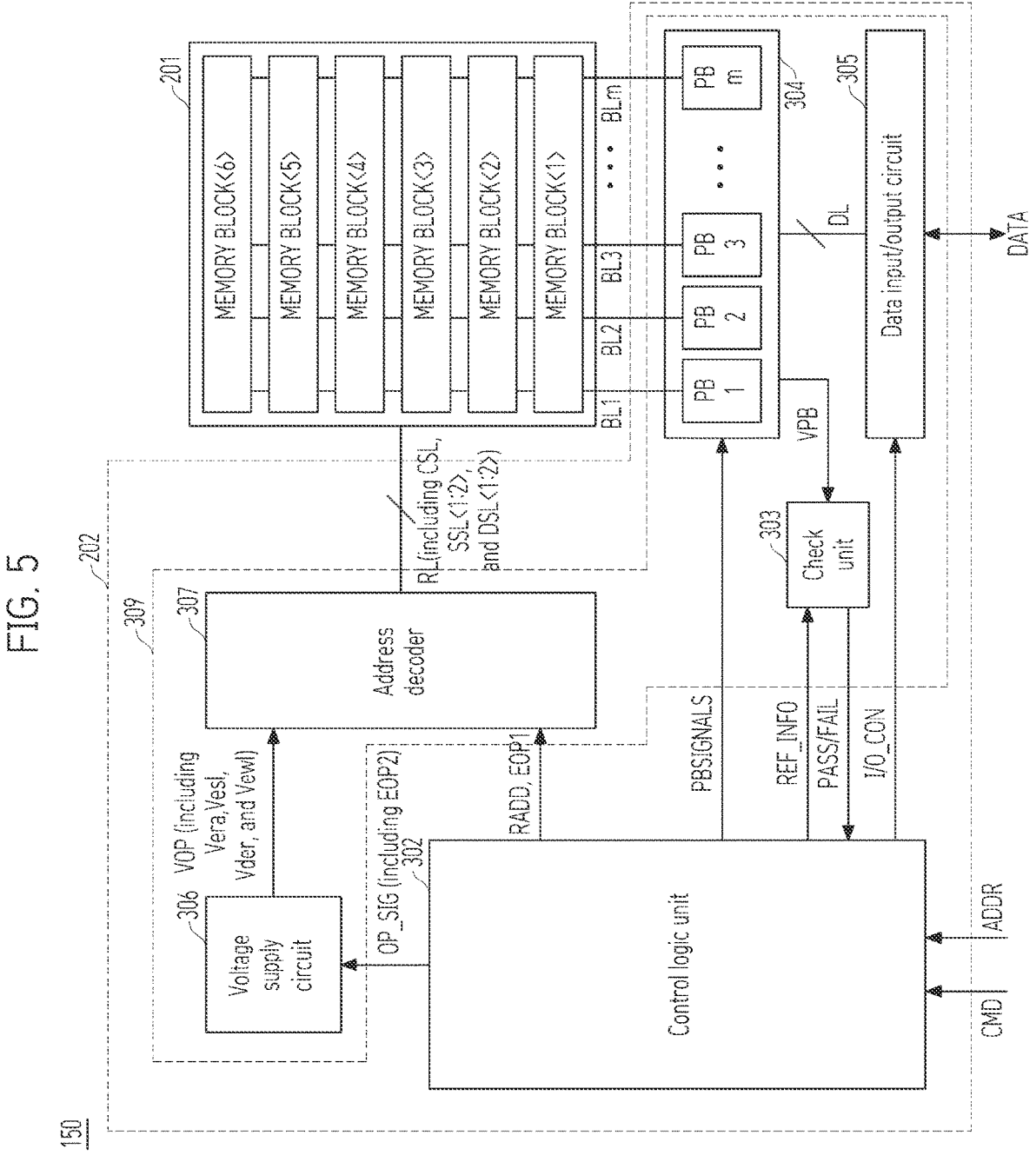
FIG. 5 is a diagram for describing a controller among the components of the memory device according to an embodiment of the present disclosure.

FIG. 5 is a diagram for describing a controller among the components of the memory device according to an embodiment of the present disclosure.

Referring to FIG. 5, the memory device 150 may include a memory cell array 201 and a control unit 202. The control unit 202 may include a control operation unit 309 and a control logic unit 302. The control operation unit 309 may include a page buffer unit 304, a checker (or check unit) 303, a data input and output (input/output) circuit 305, a voltage supply circuit 306, and an address decoder 307. The control operation unit 309, the control logic unit 302, the page buffer unit 304, and the check unit 303 include all circuits, systems, software, firmware and devices necessary for their respective operations and functions.

The memory cell array 201 may include a plurality of memory blocks, e.g., MEMORY BLOCK<1:6>. The plurality of memory blocks MEMORY BLOCK<1:6> may be connected to the address decoder 307 through a row line RL.

The plurality of memory blocks MEMORY BLOCK<1:6> may be connected to the page buffer unit 304 through bit lines BL1 to BLm. Each of the memory blocks MEMORY BLOCK<1:6> may include a plurality of memory cells.

The address decoder 307 included in the control operation unit 309 may be connected to the memory cell array 201 through the row line RL. The row line RL may include at least one source selection line SSL1, SSL2, a plurality of word lines WL<1:n>, at least one drain selection line DSL1, DSL2 and common source line CSL.

The control operation unit 309 may perform an erase operation on a memory block selected as an erase target, among the multiple memory blocks MEMORY BLOCK<1:6>, that is, an erase selection block, in response to erase operation signals EOP1 and EOP2. In this case, the erase operation for the erase selection block may include multiple erase loops EL1 to EL7. The control operation unit 309 may drive the memory cell array 201. For example, the control operation unit 309 may apply various operation voltages to a row line RL and bit lines BL1 to BLm, or may discharge a voltage applied to the row line RL and the bit lines BL1 to BLm.

The address decoder 307 may be configured to operate in response to the control of the control logic unit 302. The address decoder 307 may receive an address RADD and a first erase operation signal EOP1 from the control logic unit 302.

The address decoder 307 may be configured to decode a block address of the received address RADD. The address decoder 307 may select at least one memory block among the memory blocks MEMORY BLOCK<1:6> according to the decoded block address. The address decoder 307 may be configured to decode a row address of the received address RADD. The address decoder 307 may select at least one word line among word lines of the selected memory block according to the decoded row address. The address decoder 307 may apply a voltage VOP that is supplied by the voltage supply circuit 306 to each of drain selection lines DSL<1:2>, multiple word lines WL<1:n>, source selection lines SSL<1:2>, and a common source line CSL included in an erase selection block, in response to the first erase operation signal EOP1. For example, the address decoder 307 may select one of the multiple string groups included in an erase selection block, and may apply the voltage VOP that is supplied by the voltage supply circuit 306 to each of a drain selection line and a source selection line corresponding to the selected string group.

The voltage supply circuit 306 among the control operation unit 309 may be configured to generate a plurality of operating voltages Vop by using an external power supply voltage. The voltage supply circuit 306 may operate in response to the control of the control logic unit 302. In particular, the voltage supply circuit 306 according to an embodiment of the present disclosure may generate an erase voltage Vera, a first voltage Vesl, a second voltage Vder, and an erase word line voltage Vewl in response to the second erase operation signal EOP2 included in an operation signal OP_SIG applied by the control logic unit 302. Further, the voltage supply circuit 306 may transmit, to the address decoder 307, the erase voltage Vera, the first voltage Vesl, the second voltage Vder, and the erase word line voltage Vewl.

In an embodiment, the voltage supply circuit 306 may regulate the external power supply voltage to generate an internal power supply voltage.

In an embodiment, the voltage supply circuit 306 may generate the plurality of operating voltages Vop by using the external power supply voltage or the internal power supply voltage.

The voltage supply circuit 306 may include a plurality of pumping capacitors, which receive the internal power supply voltage, to generate the plurality of operating voltages Vop having various voltage levels. The plurality of operating voltages Vop may be generated by selectively activating the plurality of pumping capacitors in response to the control of the control logic unit 302.

The generated operating voltages Vop may be supplied to the memory cell array 201 by the address decoder 307. For example, the voltage supply circuit 306 may adjust the level and supply time of each of the operation voltages Vop in response to the operation signal OP_SIG.

The page buffer unit 304 may include a plurality of page buffers PB1 to PBm. The plurality of page buffers PB1 to PBm may be connected to the memory cell array 201 through the plurality of bit lines BL1 to BLm, respectively. The plurality of page buffers PB1 to PBm may operate under control of the control logic unit 302.

The plurality of page buffers PB1 to PBm may communicate data DATA with the data input/output circuit 157. During the program operation, the plurality of page buffers PB1 to PBm may receive the data DATA to be stored, through the data input/output circuit 305 and a data line DL.

After the start of a program operation, the multiple page buffers PB1 to PBm may store data DATA that is received from the outside through the data input/output circuit 305, and may transmit a program permission voltage or a program inhibition voltage to the bit lines BL1 to BLm in response to the stored data DATA. For example, the program permission voltage may be a logic low level, i.e., 0 V, and the program inhibition voltage may be a logic high level, i.e., a power supply voltage.

After the start of a read operation, the multiple page buffers PB1 to PBm may sense data DATA based on a voltage or current of the bit lines BL1 to BLm, which is determined based on threshold voltages of the memory cells of a selected page. Further, the multiple page buffers PB1 to PBm may transmit the sensed data DATA to the data input/output circuit 305 through the data lines DL.

The data input/output circuit 305 may include a plurality of input/output buffers that receive the data DATA inputted thereto. During the program operation, the data input/output circuit 305 may receive the data DATA to be stored from an external. During the read operation, the data input/output circuit 305 may output, to the external, the data DATA, which is transmitted from the plurality of page buffers PB1 to PBm included in the page buffer unit 302.

The check unit 303 may determine whether the number of bit lines that are connected to a cell having a threshold voltage level equal to or higher than an erase target level, among bit lines selected in the page buffer unit 302, is less than a set number in the verification interval VER included in an erase operation. Further, the check unit 303 may generate a comparison signal having a PASS value or a FAIL value based on a result of the determination. For example, when the number of bit lines that are connected to the cell having the threshold voltage level less than the erase target level, among the bit lines selected in the page buffer unit 304, is less than the set number, the check unit 303 may generate the comparison signal having the FAIL value and output the comparison signal to the control logic unit 302. For example, when the number of bit lines that are connected to the cell having the threshold voltage level less than the erase target level, among the bit lines selected in the page buffer unit 304, is the set number or more, the check unit 303 may generate the comparison signal having the PASS value and output the comparison signal to the control logic unit 302. In this case, referring to FIGS. 1A to 3, the set number may mean one of the first reference number and the second reference number.

The control logic unit 302 may be connected to the address decoder 307, the voltage supply circuit 306, the page buffer unit 304, the data input/output circuit 305, and the check unit 303 that are included in the control operation unit 309. The control logic unit 302 may be configured to control an overall operation of the memory device 150. The control logic unit 302 may operate in response to a command CMD from an external device.

The control logic unit 302 may control the control operation unit 309 by generating various signals in response to the command CMD and an address ADDR. For example, the control logic unit 302 may generate an operation signal OPSIG, an address RADD, a read and write control signal PBSIGNALS, the verify reference signal VRYBIT, and erase operation signals EOP1, EOP2 in response to the command CMD and the address ADDR. The control logic unit 302 may output an operation signal OPSIG including the second erase operation signal EOP2 to the voltage supply circuit 306, may output an address RADD and the first erase operation signal EOP1 to the address decoder 307, may output a read and write control signal PBSIGNALS to the page buffer unit 304, and may output a number information signal REF_INFO to the check unit 303. Furthermore, the control logic unit 302 may determine the results of a verification interval that is included in each of the multiple erase loops EL1 to EL7, in response to the comparison signal having the PASS value or the FAIL value, which is output by the check unit 303.

More specifically, referring to FIGS. 1A to 3, the control logic unit 302 may determine the multiple string groups ST1 and ST2 included in the erase selection block as one of pass and fail string groups in the verification interval VER of a previous erase loop, among the multiple erase loops EL1 to EL7 that are repeated in the erase operation. Further, the control logic unit 302 may generate the erase operation signals EOP1 and EOP2 having values which are adjusted based on the results of the division, and may output the erase operation signals EOP1 and EOP2 to the control operation unit 309.

The control logic unit 302 may determine, as a fail string group, a string group in which the number of memory cells checked as an erase pass in the verification interval VER of a previous erase loop, among memory cells that are connected to each of the multiple string groups ST1 and ST2 included in an erase selection block, is less than a first reference number. Further, the control logic unit 302 may determine the remaining string group as a pass string group.

When all of the multiple string groups ST1 and ST2 included in the erase selection block are checked as pass string groups in the verification interval VER of the previous erase loop, the control logic unit 302 may generate the erase operation signals EOP1 and EOP2 having a first value.

In response to the generation of the erase operation signals EOP1 and EOP2 having the first value from the control logic unit 302, the control operation unit 309 may terminate an erase operation without entering a subsequent erase loop. That is, if the control logic unit 302 has generated the erase operation signals EOP1 and EOP2 having the first value, this may mean that all of the multiple string groups ST1 and ST2 included in the erase selection block have been determined as pass string groups in the verification interval VER of the previous erase loop. Accordingly, this may mean the state in which the erase loop no longer needs to be performed at the end of the verification interval VER of the previous erase loop. For this reason, the control operation unit 309 may terminate the erase operation without entering the subsequent erase loop in response to the erase operation signals EOP1 and EOP2 having the first value. For example, all of the multiple string groups ST1 and ST2 included in the erase selection block may be determined as pass string groups in the verification interval VER of the seventh erase loop EL7 illustrated in FIG. 3. Accordingly, the control operation unit 309 may terminate the erase operation without performing the erase loop at the end of the seventh erase loop EL7.

When all of the multiple string groups ST1 and ST2 included in the erase selection block are checked as fail string groups in the verification interval VER of the previous erase loop, the control logic unit 302 may generate the erase operation signals EOP1 and EOP2 having a second value.

In response to the generation of the erase operation signals EOP1 and EOP2 having the second value from the control logic unit 302, the control operation unit 309 may apply the first voltage Vesl to each of the multiple drain selection lines DSL<1:2> corresponding to the multiple string groups ST1 and ST2 included in the erase selection block, respectively, from start timing to first timing in the pulse application interval VIO of the subsequent erase loop. That is, if the control logic unit 302 has generated the erase operation signals EOP1 and EOP2 having the second value, this may mean that all of the multiple string groups ST1 and ST2 included in the erase selection block have been determined as fail string groups in the verification interval VER of a previous erase loop. Accordingly, it is necessary to perform an erase operation on each of the multiple string groups ST1 and ST2 included in the erase selection block in the pulse application interval VIO of the subsequent erase loop normally. That is, it is necessary to drop the threshold voltage levels of memory cells that are connected to each of the multiple string groups ST1 and ST2. To this end, in response to the erase operation signals EOP1 and EOP2 having the second value, the control operation unit 309 may apply the first voltage Vesl to each of the multiple drain selection lines DSL<1:2> corresponding to the multiple string groups ST1 and ST2 included in the erase selection block, respectively, from the start timing to the first timing in the pulse application interval VIO of the subsequent erase loop.

When some of the multiple string groups ST1 and ST2 included in the erase selection block are checked as a pass string group and the remaining string group are checked as a fail string group in the verification interval VER of the previous erase loop, the control logic unit 302 may generate the erase operation signals EOP1 and EOP2 having a third value.

In response to the generation of the erase operation signals EOP1 and EOP2 having the third value from the control logic unit 302, the control operation unit 309 may determine each of the multiple string groups ST1 and ST2 included in the erase selection block as one of pass and fail string groups. In this case, the control operation unit 309 may need to prevent the threshold voltage levels of memory cells that are connected to the pass string group from dropping. To this end, the control operation unit 309 may apply the first voltage Vesl to a drain selection line corresponding to the pass string group from the start timing to second timing, and apply the second voltage Vder to the drain selection line from the second timing to the first timing, in the pulse application interval VIO of the subsequent erase loop. Furthermore, the control operation unit 309 may need to drop the threshold voltage levels of memory cells that are connected to the fail string group. To this end, the control operation unit 309 may apply the first voltage Vesl to a drain selection line corresponding to the fail string group from the start timing to the first timing in the pulse application interval VIO of the subsequent erase loop. Furthermore, the control operation unit 309 might not apply any voltage to each of the multiple drain selection lines DSL<1:2> corresponding to the multiple string groups ST1 and ST2 included in the erase selection block, respectively, from the first timing to end timing in the pulse application interval VIO of the subsequent erase loop in order to float the multiple drain selection lines DSL<1:2>.

In response to the erase operation signals EOP1 and EOP2 having the second value or the third value, the control operation unit 309 may apply a first voltage to the source selection line SSL corresponding to each of the multiple string groups from the start timing to the first timing in the pulse application interval VIO of the subsequent erase loop. Further, the control operation unit 309 might not apply any voltage to the source selection line SSL corresponding to each of the multiple string group from the first timing to the end timing in order to float the source selection line SSL.

In response to the erase operation signals EOP1 and EOP2 having the second value or the third value, the control operation unit 309 may apply an erase operation voltage, for example, a ground voltage to all of the word lines included in the erase selection block in the pulse application interval VIO of the subsequent erase loop, that is, from the start timing to the end timing.

After determining the multiple string groups ST1 and ST2 as one of the pass and fail string groups in the verification interval VER of the previous erase loop, the control logic unit 302 may check the strength of the erase pass of the pass string group.

The control logic unit 302 may change a time difference between the "second timing" and the "first timing" in the pulse application interval VIO of the subsequent erase loop based on the strength of the erase pass of the pass string group, which has been checked in the verification interval VER of the previous erase loop. Here, the "second timing" is timing at which the second voltage starts to be applied to the drain selection line DSL corresponding to the pass string group, and the "first timing" is timing at which the drain selection line DSL is floated. To this end, the control logic unit 302 may determine each of the multiple string groups ST1 and ST2 as one of a strong pass string group and a weak pass string group. For the strong pass string group, the strength of the erase pass of the pass string group, which has been checked in the verification interval VER of the previous erase loop, is a reference value or more. For the weak pass string group, the strength of the erase pass of the pass string group, which has been checked in the verification interval VER of the previous erase loop, less than the reference value. Further, the control logic unit 302 may generate the erase operation signals EOP1 and EOP2 having values which are adjusted based on the results of the division.

The control logic unit 302 may determine, as a fail string group, a string group in which the number of memory cells checked as an erase pass in the verification interval VER of a previous erase loop, among memory cells that are connected to each of the multiple string groups ST1 and ST2 included in an erase selection block, is less than a first reference number. Further, the control logic unit 302 may determine, as a pass string group, a string group in which the number of memory cells checked as an erase pass in the verification interval VER of the previous erase loop, among the memory cells that are connected to each of the multiple string groups ST1 and ST2 included in the erase selection block, is the first reference number or more. Furthermore, the control logic unit 302 may simultaneously determine, as a weak pass string group, a string group in which the number of memory cells checked as an erase pass in the verification interval VER of the previous erase loop is the first reference number or more to less than the second reference number, among the pass string groups, and determine, as a strong pass string group, a string group in which the number of memory cells checked as an erase pass in the verification interval VER of the previous erase loop is the second reference number or more. In this case, the second reference number may be greater than the first reference number.

When all of the multiple string groups ST1 and ST2 included in the erase selection block are checked as pass string groups in the verification interval VER of the previous erase loop, the control logic unit 302 may generate the erase operation signals EOP1 and EOP2 having the first value.

In response to the generation of the erase operation signals EOP1 and EOP2 having the first value from the control logic unit 302, the control operation unit 309 may terminate an erase operation without entering a subsequent erase loop.

When all of the multiple string groups ST1 and ST2 included in the erase selection block are checked as fail string groups in the verification interval VER of the previous erase loop, the control logic unit 302 may generate the erase operation signals EOP1 and EOP2 having the second value.

In response to the generation of the erase operation signals EOP1 and EOP2 having the second value from the control logic unit 302, the control operation unit 309 may apply the first voltage Vesl to each of the multiple drain selection lines DSL<1:2> corresponding to the multiple string groups ST1 and ST2 included in the erase selection block, respectively, from the start timing to the first timing in the pulse application interval VIO of the subsequent erase loop.

When some of the multiple string groups ST1 and ST2 included in the erase selection block are checked as weak pass string groups, some of the multiple string groups ST1 and ST2 included in the erase selection block are checked as strong pass string groups, and the remaining string groups are checked as fail string groups, the control logic unit 302 may generate the erase operation signals EOP1 and EOP2 having a fourth value in the verification interval VER of the previous erase loop.

In response to the generation of the erase operation signals EOP1 and EOP2 having the fourth value from the control logic unit 302, the control operation unit 309 may determine each of the multiple string groups ST1 and ST2 included in the erase selection block as one of a weak pass string group, a strong pass string group, and a fail string group. In this case, the control operation unit 309 may need to strongly prevent the threshold voltage levels of memory cells that are connected to the strong pass string group from dropping. To this end, the control operation unit 309 may apply the first voltage Vesl to a drain selection line corresponding to the pass string group from start timing to second timing that is earlier than first timing by a first time, and apply the second voltage Vder to the drain selection line from the second timing to the first timing, in the pulse application interval VIO of a subsequent erase loop. Furthermore, the control operation unit 309 may need to weakly prevent the threshold voltage levels of memory cells that are connected to the weak pass string group from dropping. To this end, the control operation unit 309 may apply the first voltage Vesl to the drain selection line corresponding to the pass string group from the start timing to the second timing that is earlier than the first timing by a second time, and apply the second voltage Vder to the drain selection line from the second timing to the first timing, in the pulse application interval VIO of the subsequent erase loop. In this case, the first time may be longer than the second time. That is, the control operation unit 309 may operate so that timing at which the second voltage is applied to the drain selection line DSL corresponding to the strong pass string group is earlier than timing at which the second voltage is applied to the drain selection line DSL corresponding to the weak pass string group. Furthermore, the control operation unit 309 may need to drop the threshold voltage levels of memory cells that are connected to the fail string group. To this end, the control operation unit 309 may apply the first voltage Vesl to a drain selection line corresponding to the fail string group from the start timing to the first timing in the pulse application interval VIO of the subsequent erase loop.

In response to the erase operation signals EOP1 and EOP2 having the second value or the fourth value, the control operation unit 309 may apply a first voltage to the source selection line SSL corresponding to each of the multiple string groups from the start timing to the first timing in the pulse application interval VIO of the subsequent erase loop. Further, the control operation unit 309 might not apply any voltage to the source selection line SSL corresponding to each of the multiple string group from the first timing to end timing in order to float the source selection line SSL.

In response to the erase operation signals EOP1 and EOP2 having the second value or the fourth value, the control operation unit 309 may apply an erase operation voltage, for example, a ground voltage to all of the word lines included in the erase selection block in the pulse application interval VIO of the subsequent erase loop, that is, from the start timing to the end timing.

Figure 6:
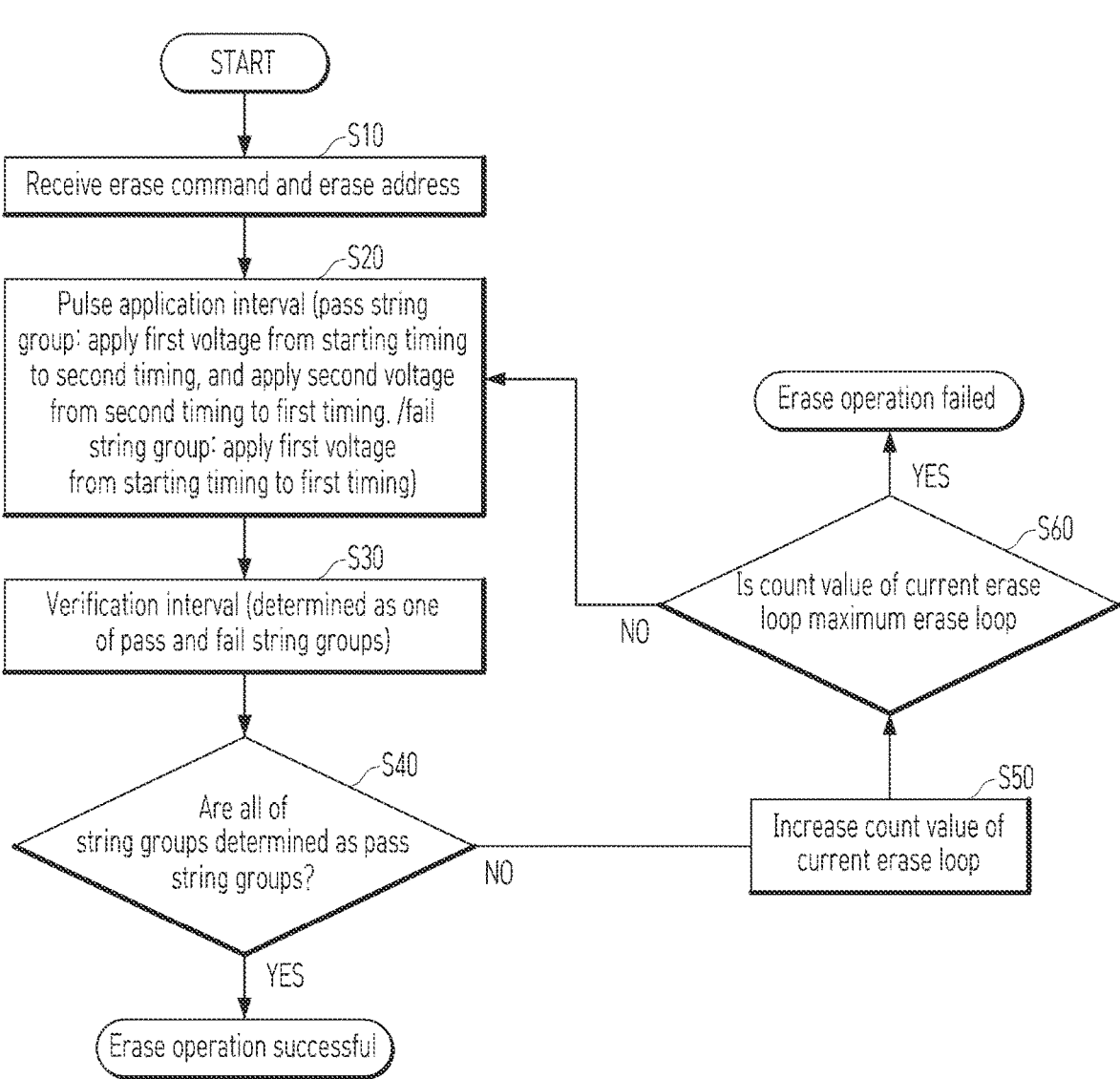
FIG. 6 is a flowchart for describing the sequence of an erase operation that is performed in the memory device according to an embodiment of the present disclosure.

FIG. 6 is a flowchart for describing the sequence of an erase operation that is performed in the memory device according to an embodiment of the present disclosure.

Referring to FIG. 6, the erase command and the erase address may be input to the memory device 150 (S10).

In response to the erase command and the erase address being input in S10, one of the multiple memory blocks MEMORY BLOCK<1:6> may be selected as an erase selection block, and an operation for the pulse application interval VIO included in an erase loop may be performed on the erase selection block (S20).

In S20, in the case of a pass string group, among the multiple string groups ST1 and ST2 included in the erase selection block, the first voltage Vesl may be applied to the drain selection line DSL corresponding to the pass string group from start timing to second timing in the pulse application interval VIO, and the second voltage Vder may be applied to the drain selection line DSL from the second timing to first timing in the pulse application interval VIO.

In S20, in the case of a fail string group, among the multiple string groups ST1 and ST2 included in the erase selection block, the first voltage Vesl may be applied to the drain selection line DSL corresponding to the fail string group from the start timing to the first timing in the pulse application interval VIO.

In S20, in the case of the first erase loop EL1 that is first performed, among the multiple erase loops EL1 to EL7, all of the multiple string groups ST1 and ST2 included in the erase selection block may be determined as fail string groups.

After S20, an operation for the verification interval VER included in the erase loop may be performed (S30).

In S30, each of the multiple string groups ST1 and ST2 included in the erase selection block may be determined as one of pass and fail string groups.

Whether all of the multiple string groups ST1 and ST2 included in the erase selection block have been determined as the pass string group in S30 may be checked (S40).

When all of the multiple string groups ST1 and ST2 included in the erase selection block are determined as the pass string group in S30 (YES in S40), the erase operation may be terminated by determining that the erase operation for the erase selection block has been successful.

When at least one of the multiple string groups ST1 and ST2 included in the erase selection block is checked as a fail string group in S30 (NO in S40), the count value of a current erase loop may be increased (S50). In this case, when the erase operation is not successful in the first erase loop EL1, the count value of the current erase loop may be increased from the first erase loop EL1 to the second erase loop EL2 in S50.

After S50, whether the count value of the current erase loop is a maximum count value of an erase loop may be checked (S60).

When the count value of the current erase loop is the maximum count value of the erase loop in S60 (YES in S60), the erase operation for the erase selection block may be determined to be a fail, and the erase operation may be then terminated.

When the count value of the current erase loop is not the maximum count value of the erase loop in S60 (NO in S60), S20 to S60 for the current erase loop, for example, the second erase loop EL2 may be sequentially performed.

Although various embodiments of the present disclosure have been described for illustrative purposes, it will be apparent to those skilled in the art that various changes and modifications may be made without departing from the spirit and scope of the invention as defined in the following claims. Furthermore, the embodiments may be combined to form additional embodiments.

What is claimed is:

1. A memory device comprising:
   a memory block comprising K string groups that are coupled to multiple bit lines by K drain selection lines, respectively, and that are coupled to a common source line by K source selection lines, respectively; and
   a controller configured to repeat one or more erase loops when an erase operation for the memory block is successful, each erase loop comprising a pulse application interval and a verification interval, configured to determine the K string groups as one of pass and fail string groups in a verification interval of a previous erase loop among the erase loops, and configured to apply a first voltage to a drain selection line corresponding to the fail string group from start timing to first timing, apply the first voltage to a drain selection line corresponding to the pass string group from the start timing to second timing earlier than the first timing, and apply a second voltage greater than the first voltage to the drain selection line corresponding to the pass string group from the second timing to the first timing in a pulse application interval of a subsequent erase loop among the erase loops, which is subsequent to the previous erase loop,
   wherein K is a natural number greater than or equal to 2.

2. The memory device of claim 1, wherein the controller includes:

a control operation unit configured to repeatedly perform the erase loops on the memory block in response to an erase operation signal; and a control logic unit configured to determine each of the K string groups as one of the fail and pass string groups in the verification interval of the previous erase loop, and configured to generate the erase operation signal having a value adjusted based on a result of the determination.

3. The memory device of claim 2, wherein the control logic unit is configured to determine, as the fail string group, a string group in which a number of memory cells checked as an erase pass in the verification interval of the previous erase loop, among memory cells that are coupled to each of the K string groups, is less than a first reference number, and determine a remaining string group as the pass string group.

4. The memory device of claim 3, wherein the control logic unit is configured to in the verification interval of the previous erase loop, generate the erase operation signal having a first value when all of the K string groups are determined as the pass string group, generate the erase operation signal having a second value when all of the K string groups are determined as the fail string group, and generate the erase operation signal having a third value when some of the K string groups are determined as the pass string group and remaining string group are determined as the fail string group.

5. The memory device of claim 4, wherein the control operation unit is configured to terminate the erase operation without entering the subsequent erase loop in response to the first value of the erase operation signal, apply the first voltage to each of the K drain selection lines from the start timing to the first timing in response to the second value of the erase operation signal, and determine each of the K string groups as one of the pass and fail string groups in response to the third value of the erase operation signal, apply the first voltage to the drain selection line corresponding to the pass string group from the start timing to the second timing, apply the second voltage to the drain selection line corresponding to the pass string group from the second timing to the first timing, and apply the first voltage to the drain selection line corresponding to the fail string group from the start timing to the first timing.

6. The memory device of claim 2, wherein the control logic unit is configured to check a strength of an erase pass of the pass string group, and change a time difference between the first timing and the second timing based on a result of the check.

7. The memory device of claim 6, wherein the control logic unit is configured to determine each of the pass string groups as a strong pass string group in which the strength of the erase pass is a reference value or more and a weak pass string group in which the strength of the erase pass is less than the reference value in the verification interval of the previous erase loop, and configured to generate the erase operation signal having the value adjusted based on a result of the determination.

8. The memory device of claim 7, wherein the control logic unit is configured to determine, as the fail string group, a string group in which a number of memory cells checked as the erase pass in the verification interval of the previous erase loop, among memory cells that are coupled to each of the K string groups, is less than a first reference number, determine, as the pass string group, a string group in which the number of memory cells checked as the erase pass is the first reference number or more, determine, as the weak pass string group, a string group in which the number of memory cells checked as the erase pass is less than a second reference number, among the pass string groups, and determine, as the strong pass string group, a string group in which the number of memory cells checked as the erase pass is the second reference number or more, among the pass string groups.

9. The memory device of claim 8, wherein the control logic unit is configured to generate the erase operation signal having a first value when all of the K string groups are checked as the pass string group in the verification interval of the previous erase loop, generate the erase operation signal having a second value when all of the K string groups are checked as the fail string group in the verification interval of the previous erase loop, and generate the erase operation signal having a fourth value when some of the K string groups are determined as the weak pass string groups in the verification interval of the previous erase loop, other of the K string groups are determined as the strong pass string group in the verification interval of the previous erase loop, and remaining string group are determined as the fail string groups in the verification interval of the previous erase loop.

10. The memory device of claim 9, wherein the control operation unit is configured to terminate the erase operation without entering the subsequent erase loop in response to the first value of the erase operation signal, apply the first voltage to each of the K drain selection lines from the start timing to the first timing in response to the second value of the erase operation signal, and determine each of the K string groups as one of the weak pass string group, the strong pass string group, and the fail string group in response to the fourth value of the erase operation signal, apply the first voltage to a drain selection line corresponding to the strong pass string group from the start timing to the second timing that is earlier than the first timing by a first time, apply the second voltage to the drain selection line corresponding to the strong pass string group from the second timing to the first timing, apply the first voltage to a drain selection line corresponding to the weak pass string group from the start timing to the second timing that is earlier than the first timing by a second time, apply the second voltage to the drain selection line corresponding to the weak pass string group from the second timing to the first timing, and apply the first voltage to a drain selection line corresponding to the fail string group from the start timing to the first timing, and wherein the first time is longer than the second time.

11. The memory device of claim 1, wherein the controller is configured to apply the first voltage to each of the K source selection lines from the start timing to the first timing in the pulse application interval of the subsequent erase loop, and apply an erase voltage to the multiple bit lines and a common source line from the first timing to end timing in a state in which each of the K drain selection lines and the K source selection lines has been floated.

12. The memory device of claim 11, wherein:

the first voltage has a voltage level of a ground voltage or a lower voltage level than the ground voltage, and the second voltage has a higher voltage level than the ground voltage and has a lower voltage level than the erase voltage.

13. An operating method of a memory device comprising K string groups that are coupled to multiple bit lines by K drain selection lines, respectively, and that are coupled to a common source line by K source selection lines, respectively, the operating method comprising:

an erase operation of repeating one or more erase loops until the erase operation for the memory block is successful, each erase loop comprising a pulse application interval and a verification interval;

a determination operation of determining the K string groups as one of a pass string group and a fail string group in the verification interval of a previous erase loop, among erase loops that are repeated in the erase operation;

a first application operation of applying a first voltage to a drain selection line corresponding to the fail string group that has been determined from start timing to first timing in the pulse application interval of a subsequent erase loop subsequent to the previous erase loop; and a second application operation of applying the first voltage to a drain selection line corresponding to the pass string group that has been determined from the start timing to second timing earlier than the first timing and applying a second voltage greater than the first voltage to the drain selection line corresponding to the pass string group from the second timing to the first timing, in the pulse application interval of the subsequent erase loop, wherein K is a natural number greater than or equal to 2.

14. The operating method of claim 13, wherein the determination operation comprises determining, as the fail string group, a string group in which a number of memory cells checked as an erase pass in the verification interval of the previous erase loop, among memory cells that are connected to each of the K string groups, is less than a first reference number, and determining a remaining string group as the pass string group.

15. The operating method of claim 13, wherein:

the determination operation comprises checking a strength of an erase pass of the pass string group, and the second application operation comprises changing a time difference between the first timing and the second timing based on the strength of the erase pass of the pass string group, which has been checked.

16. The operating method of claim 15, wherein the determination operation comprises:

determining, as the fail string group, a string group in which a number of memory cells checked as the erase pass in the verification interval of the previous erase loop, among memory cells that are connected to each of the K string groups, is less than a first reference number, determining, as the pass string group, a string group in which the number of memory cells checked as the erase pass is the first reference number or more, determining, as a weak pass string group, a string group in which the number of memory cells checked as the erase pass is less than a second reference number, among the pass string groups, and determining, as a strong pass string group, a string group in which the number of memory cells checked as the erase pass is the second reference number or more, among the pass string groups.

17. The operating method of claim 16, wherein the second application operation comprises:

applying the first voltage to a drain selection line corresponding to the strong pass string group that has been determined from the start timing to the second timing that is earlier than the first timing by a first time, and applying the second voltage to the drain selection line corresponding to the strong pass string group from the second timing to the first timing;

applying the first voltage to a drain selection line corresponding to the weak pass string group that has been determined from the start timing to the second timing that is earlier than the first timing by a second time, and applying the second voltage to the drain selection line corresponding to the weak pass string group from the second timing to the first timing; and applying the first voltage to a drain selection line corresponding to the fail string group that has been determined from the start timing to the first timing, and wherein the first time is longer than the second time.

18. The operating method of claim 17, further comprising:

generating an erase operation signal having a first value when all of the K string groups are checked as the pass string group in the verification interval of the previous erase loop, generating the erase operation signal having a second value when all of the K string groups are checked as the fail string group in the verification interval of the previous erase loop, generating the erase operation signal having a fourth value when some of the K string groups are determined as the weak pass string groups in the verification interval of the previous erase loop, other of the K string groups are determined as the strong pass string group in the verification interval of the previous erase loop, and remaining string group are determined as the fail string groups in the verification interval of the previous erase loop, terminating the erase operation without entering the subsequent erase loop in response to the first value of the erase operation signal, applying the first voltage to each of the K drain selection lines from the start timing to the first timing in response to the second value of the erase operation signal, and determining each of the K string groups as one of the weak pass string group, the strong pass string group, and the fail string group in response to the fourth value of the erase operation signal.

19. The operating method of claim 13, further comprising:

applying the first voltage to each of the K source selection lines from the start timing to the first timing in the pulse application interval of the subsequent erase loop; and applying an erase voltage to the multiple bit lines and the common source line in a state in which each of the K drain selection lines and the K source selection lines has been floated from the first timing to end timing in the pulse application interval of the subsequent erase loop.

20. The operating method of claim 13, wherein:

the first voltage has a voltage level of a ground voltage or a lower voltage level than the ground voltage, and the second voltage has a higher voltage level than the ground voltage and has a lower voltage level than the erase voltage.

\* \* \* \* \*